United States Patent
Hashimoto

(10) Patent No.: US 10,554,022 B2
(45) Date of Patent: Feb. 4, 2020

(54) QUANTUM CASCADE LASER

(71) Applicant: SUMITOMO ELECTRIC INDUSTRIES, LTD., Osaka (JP)

(72) Inventor: Jun-ichi Hashimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/011,818

(22) Filed: Jun. 19, 2018

(65) Prior Publication Data

US 2018/0375293 A1    Dec. 27, 2018

(30) Foreign Application Priority Data

Jun. 22, 2017    (JP) ................. 2017-122339

(51) Int. Cl.
  *H01S 5/34*    (2006.01)
  *H01S 5/026*    (2006.01)
  (Continued)

(52) U.S. Cl.
  CPC ........... *H01S 5/3402* (2013.01); *H01S 5/026* (2013.01); *H01S 5/028* (2013.01); *H01S 5/0287* (2013.01);
  (Continued)

(58) Field of Classification Search
  CPC .... H01S 5/3401; H01S 5/3402; H01S 5/3418; H01S 5/3419; H01S 5/028–0286; H01S 3/0619–0625
  See application file for complete search history.

(56) References Cited

U.S. PATENT DOCUMENTS

| 4,751,710 A | 6/1988 | Yamaguchi et al. |
| 5,180,685 A | 1/1993 | Yamamoto et al. |

(Continued)

FOREIGN PATENT DOCUMENTS

| DE | 102008045980 | 6/2010 |
| DE | 102015116335 | 3/2017 |

OTHER PUBLICATIONS

S.R. Darvish, et al., "High-power, continuous-wave operation of distributed-feedback quantum-cascade lasers at λ 7.8 μm", *Applied Physics Letters*, 89, 251119 (2006).

(Continued)

*Primary Examiner* — Tod T Van Roy
(74) *Attorney, Agent, or Firm* — Smith, Gambrell & Russell, LLP.

(57) ABSTRACT

A quantum cascade laser includes: a substrate including a substrate end face; a semiconductor laminate having a laminate end face and a core extending in an axial direction; a first electrode disposed on the semiconductor laminate; a second electrode disposed on a back surface of the substrate; an insulating film disposed on the laminate end face and the first electrode; and a first metal film disposed on the laminate end face, the insulating film and the first electrode, the insulating film being between the first metal film and the semiconductor laminate. The substrate end face and the laminate end face extend along a reference plane intersecting the axial direction. The substrate end face has a first area and a second area arranged in a direction from the back surface to a principal surface of the substrate, and the first metal film has an end on the second area.

1 Claim, 20 Drawing Sheets

(51) Int. Cl.
*H01S 5/343* (2006.01)
*H01S 5/12* (2006.01)
*H01S 5/028* (2006.01)
H01S 5/042 (2006.01)
H01S 5/022 (2006.01)

(52) U.S. Cl.
CPC ............ *H01S 5/12* (2013.01); *H01S 5/34313* (2013.01); *H01S 5/02272* (2013.01); *H01S 5/0425* (2013.01)

(56) References Cited

U.S. PATENT DOCUMENTS

| | | | |
|---|---|---|---|
| 5,677,922 | A | 10/1997 | Hayafuji et al. |
| 5,943,553 | A | 8/1999 | Spaeth |
| 6,289,030 | B1 | 9/2001 | Charles |
| 6,326,646 | B1 | 12/2001 | Baillargeon et al. |
| 6,355,505 | B1 | 3/2002 | Maeda et al. |
| 6,647,047 | B2 | 11/2003 | Yokota |
| 6,710,375 | B2 | 3/2004 | Oshima |
| 9,184,563 | B1 | 11/2015 | Raring et al. |
| 2003/0035453 | A1 | 2/2003 | Fitz et al. |
| 2004/0101013 | A1 | 5/2004 | Yokota |
| 2004/0233950 | A1 | 11/2004 | Furukawa et al. |
| 2004/0238810 | A1 | 12/2004 | Dwilinski et al. |
| 2005/0151150 | A1 | 7/2005 | Choi |
| 2006/0239321 | A1 | 10/2006 | Kume et al. |
| 2006/0274804 | A1 | 12/2006 | Behfar et al. |
| 2009/0067464 | A1 | 3/2009 | Tanaka |
| 2009/0086782 | A1 | 4/2009 | Yokoyama et al. |
| 2013/0028280 | A1* | 1/2013 | Hongo ................ H01S 5/02461 372/44.01 |
| 2013/0107534 | A1 | 5/2013 | Avramescu et al. |
| 2013/0250994 | A1 | 9/2013 | Moenster et al. |
| 2013/0301666 | A1 | 11/2013 | Stagatescu et al. |
| 2013/0322480 | A1* | 12/2013 | Edamura ............. H01S 5/3401 372/45.01 |
| 2014/0211819 | A1 | 7/2014 | Yoshida et al. |
| 2014/0239250 | A1 | 8/2014 | Fang et al. |
| 2015/0117484 | A1* | 4/2015 | Sugiyama ............ H01S 5/0285 372/45.01 |
| 2018/0069374 | A1* | 3/2018 | Kakuno ................ H01S 5/0206 |

OTHER PUBLICATIONS

Manijeh Razeghi, "High-Performance InP-Based Mid-IR Quantum Cascade Lasers", *IEEE Journal of Selected Topics in Quantum Electronics*, vol. 15, No. 3, p. 941-p. 951, May/Jun. 2009.

Notice of Allowance for U.S. Appl. No. 16/006,666 dated Apr. 3, 2019.

Notice of Allowance for U.S. Appl. No. 16/011,869 dated Jan. 10, 2019.

Non-Final Office Action dated Jan. 11, 2019 in U.S. Appl. No. 16/006,708.

Notice of Allowance for U.S. Appl. No. 16/006,666 dated Jan. 11, 2019.

Notice of Allowance for U.S. Appl. No. 16/011,928 dated Jan. 11, 2019.

Non-Final Office Action dated Jan. 11, 2019 in U.S. Appl. No. 16/009,044.

* cited by examiner

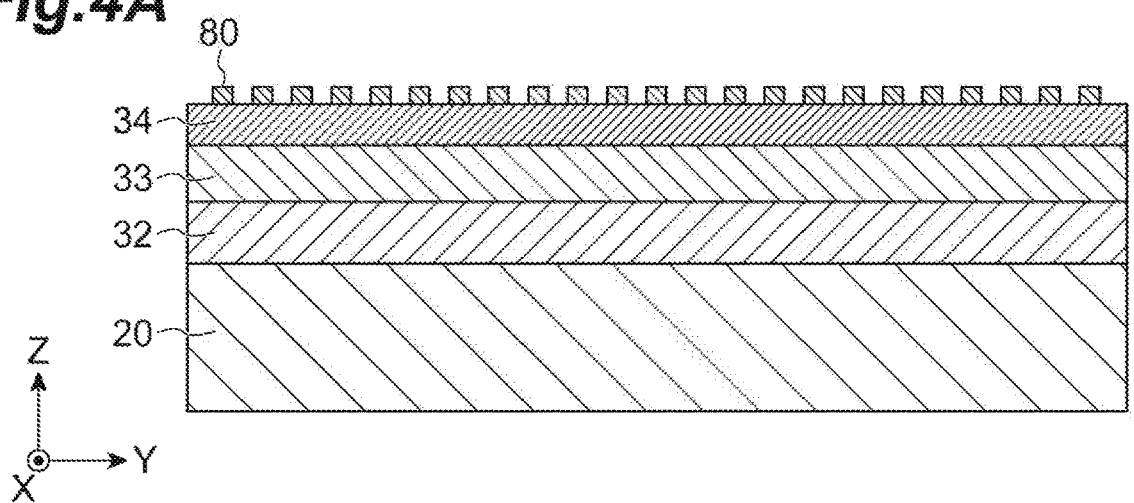
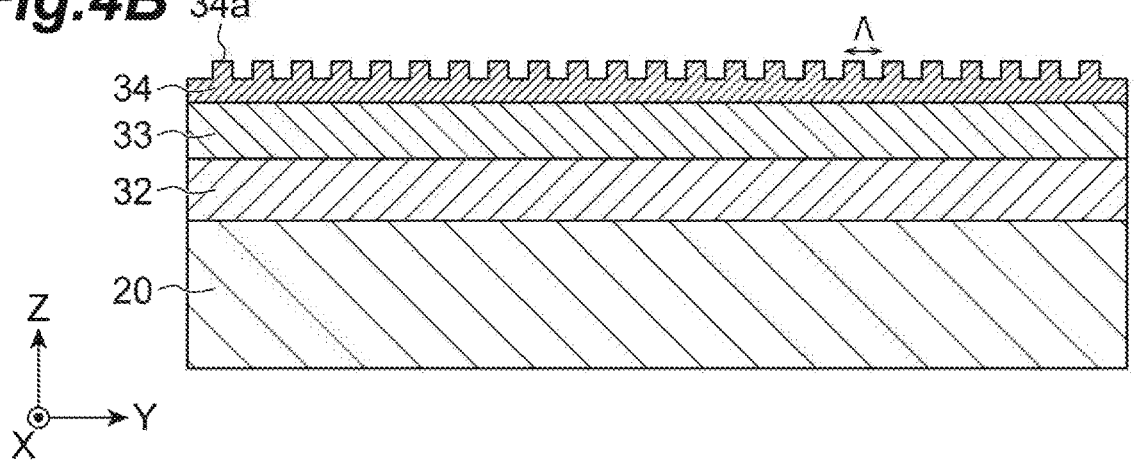
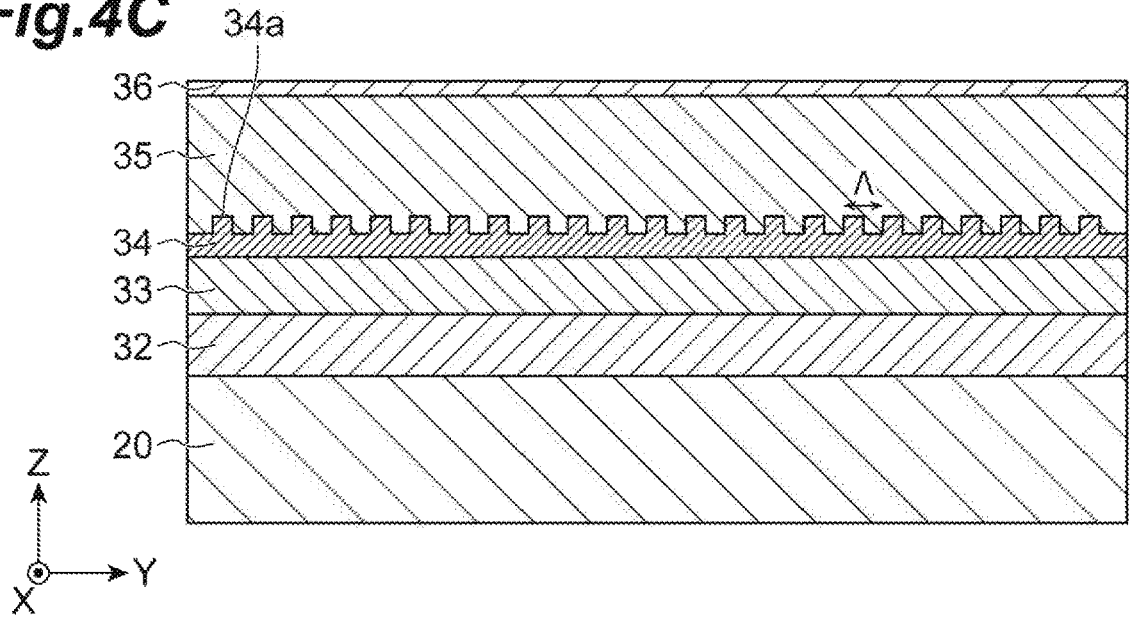

QUANTUM CASCADE LASER

BACKGROUND OF THE INVENTION

Field of the Invention

The present invention relates to a quantum cascade laser. This application claims the benefit of priority from Japanese Patent application No. 2017-122339 filed on Jun. 22, 2017, which is herein incorporated by reference in its entirety.

Related Background Art

Non-patent document (S. R. Darvish, et al. "High-power, continuous-wave operation of distributed-feedback quantum-cascade lasers at λ 7.8 μm", Applied Physics Letters 89, 251119, 2006) discloses a quantum cascade laser.

SUMMARY OF THE INVENTION

A quantum cascade laser according to one aspect of the present invention comprises: a substrate including a principal surface, a back surface, and a substrate end face, the principal surface and the back surface being arranged in a first direction, the principal surface being opposite to the back surface, the substrate end face intersecting a second direction, and the second direction intersecting the first direction; a semiconductor laminate disposed on the principal surface of the substrate, the semiconductor laminate having a laminate end face, and the semiconductor laminate including a core layer extending from the laminate end face in the second direction, and a cladding layer disposed on the core layer, the substrate end face and the laminate end face extending along a reference plane intersecting the second direction; a first electrode disposed on the semiconductor laminate; a second electrode disposed on the back surface of the substrate; an insulating film disposed on the laminate end face and the first electrode; and a first metal film disposed on the laminate end face, the insulating film and the first electrode, the insulating film being between the first metal film and the semiconductor laminate, the semiconductor laminate and the substrate being disposed between the first electrode and the second electrode, the substrate end face having a first area and a second area, the first area and the second area being arranged in a direction from the back surface of the substrate to the principal surface thereof, and the first metal film having an end on the second area.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 4A is a schematic view showing a major process in the method for fabricating a quantum cascade semiconductor laser, shown in FIG. 1, according to the embodiment.

FIG. 4B is a schematic view showing a major process in the method according to the embodiment.

FIG. 4C is a schematic view showing a major process in the method according to the embodiment.

DESCRIPTION OF THE EMBODIMENTS

Figure 1:
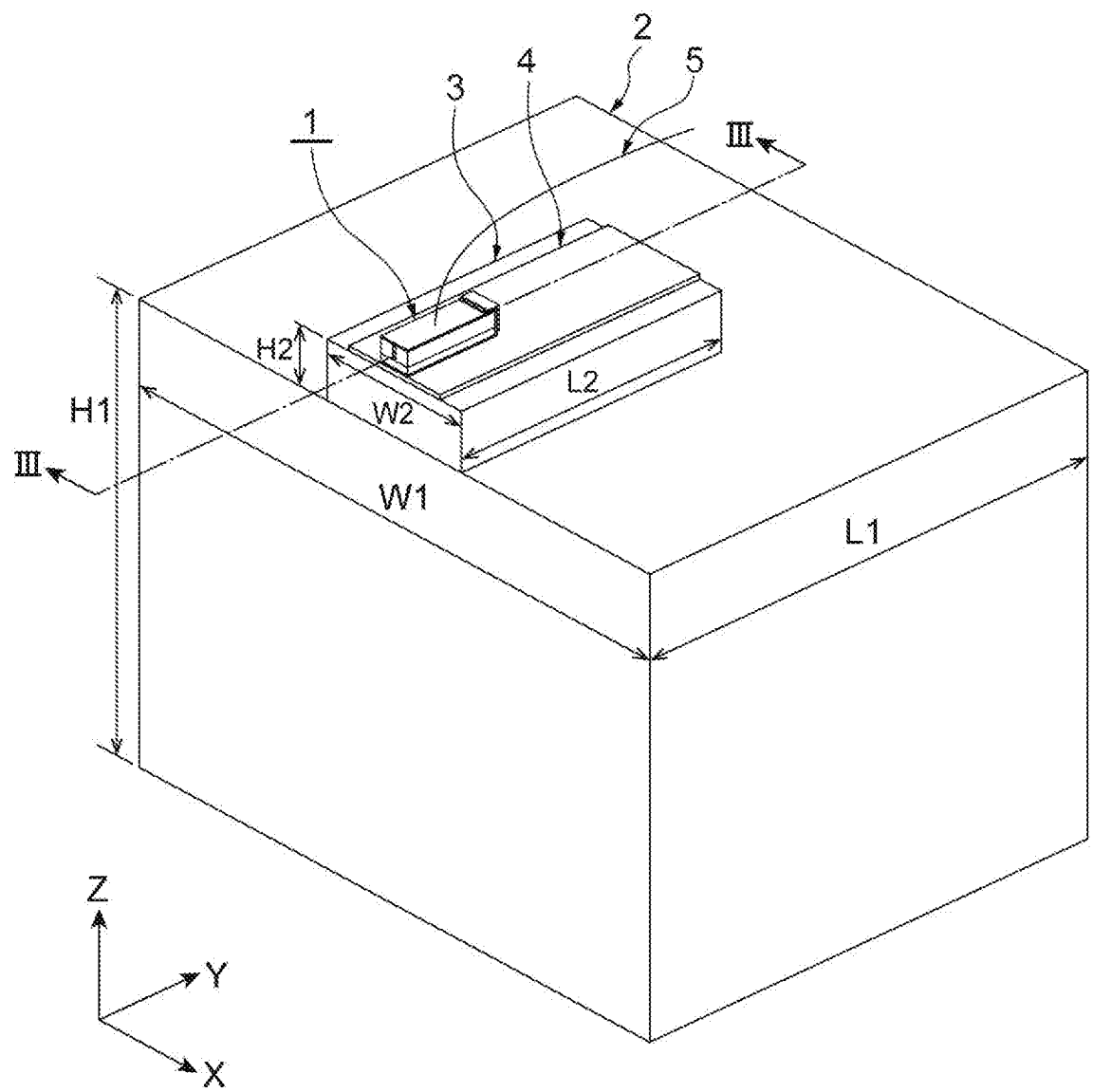
FIG. 1 is a perspective view showing a quantum cascade semiconductor laser, which is die-bonded, according to an embodiment.

A quantum cascade laser includes a lower electrode, a semiconductor substrate, a semiconductor laminate, and an upper electrode, which are arranged to form a device structure. The quantum cascade laser further has a metal film for the lasing cavity and an insulating film on the end face with the insulating film disposed between the metal film and the end face. The insulating film is made of $SiO_2$, and the metal film is made of Au. This quantum cascade laser is mounted on an electronic component with solder.

The quantum cascade laser is provided with the laser cavity that includes the end face, and may have a reflection film made of a metal film, which is formed on the end face, making the reflectance at the end face enhanced. A metal film making direct contact with the end face, which includes end faces of layers of the semiconductor device, causes short-circuit at the end face. The quantum cascade laser is provided with an insulating film, which is disposed between the end face and the metal film, to separate the metal film from the end face. The insulating film and the metal film are sequentially formed on the end face by supplying respective raw materials toward the end face. In forming these films, the raw materials thereof fly along the upper and lower electrodes to form deposited materials on these electrodes, thereby providing the quantum cascade laser with the insulating film and the metal film on the end face. This quantum cascade laser can be mounted on the electronic component, for example, with solder, so that the deposited metallic material on the lower electrode comes in contact with the solder. The quantum cascade laser thus mounted, which causes the solder to connect the lower electrode to the metallic deposited material, receives a voltage (for example, a voltage of 10 volts or more) applied between the upper and lower electrodes for lasing, so that the high voltage is applied to the metal film. This high voltage on the metal film is finally applied to the insulating film between the upper electrode and the deposited metallic material on the upper electrode.

The deposited material for the insulating film, however, has an extremely small thickness on the upper electrode, which is smaller than (as small as, for example, about one severalth of) that of the insulating film on the end face. The application of a high voltage, for example, 10 volts or more to the extremely thin deposited material for the insulating film between the upper electrode and the metal film on the upper electrode may break down the extremely thin deposited material in the vicinity of the end face to form a broken-down portion, and a large amount of current (referred to as inrush current) flows through the broken-down portion in the deposited material, leading to a failure, such as breakdown of the end face, in the quantum cascade laser.

Forming a thick deposited material on the upper electrode makes a thickness of the insulating film on the end face large (for example, a thickness several times larger than the target thickness). This thick insulating film needs a long deposition time, resulting in reduction in the productivity of the quantum cascade laser. Further, the thick insulating film on the end face may produce an additional stress to the end face, resulting in deterioration of the end face in quality, and occurrence of cracking and/or peeling of the insulating film.

It is an object of the one aspect of the present invention to provide a quantum cascade laser, which has an insulating film and a metal film stacked on an end face, capable of reducing the occurrence of break-down of the insulating film.

A description will be given of embodiments according to the above aspect below.

A quantum cascade laser according to an embodiment includes: (a) a substrate including a principal surface, a back surface, and a substrate end face, the principal surface and the back surface being arranged in a first direction, the principal surface being opposite to the back surface, the substrate end face intersecting a second direction, and the second direction intersecting the first direction; (b) a semiconductor laminate disposed on the principal surface of the substrate, the semiconductor laminate having a laminate end face, and the semiconductor laminate including a core layer extending from the laminate end face in the second direction, and a cladding layer disposed on the core layer, the substrate end face and the laminate end face being arranged along a reference plane; (c) a first electrode disposed on the semiconductor laminate; (d) a second electrode disposed on the back surface of the substrate; (e) an insulating film disposed on the laminate end face and on the first electrode; and (f) a first metal film disposed on the laminate and face, the insulating film and the first electrode. The insulating film is between the first metal film and the semiconductor laminate. The semiconductor laminate and the substrate are disposed between the first electrode and the second electrode. The substrate end face has a first area and a second area, and the first area and the second area are arranged in a direction from the back surface of the substrate to the principal surface thereof. The first metal film has an end on the second area.

In the quantum cascade laser, the first metal film is disposed on the laminate end face, the insulating film and the first electrode, and the insulating film are between the first metal film and the laminate end face. The substrate end face has first and second areas arranged in a direction from the back to principal surfaces of the substrate. The first metal film has an end on the second area. Terminating the first metal film on the second area can separate the first metal film from the second electrode and a solder material which makes contact with the second electrode in fixing the quantum cascade laser to an electronic component.

In the quantum cascade laser according an embodiment, the insulating film may extend on the second electrode. The quantum cascade laser has no metal on the insulating film located on the second electrode. The quantum cascade laser has an outer surface at which the insulating film on the second electrode appears.

The quantum cascade laser according to an embodiment further includes a second metal film on the substrate end face and the second electrode, and the second metal film has an end on the substrate end face and the end of the second metal film is apart from the first metal film.

In the quantum cascade laser according to an embodiment, the insulating film may have an edge on the second area. The quantum cascade semiconductor laser prevents the insulating film from covering all of the end face of the substrate, thereby enhancing the dissipation of heat from the end face of the substrate.

In the quantum cascade laser according to an embodiment, the semiconductor laminate includes a first region and a second region arranged in the second direction, the second region has the laminate end face. The first electrode has a first thickness in the first region and a second thickness in the second region, and the second thickness is smaller than the first thickness.

The quantum cascade semiconductor laser allows the first electrode to have a second thickness in the second region, and the first electrode on the second region makes the cleavage easy, thereby enhancing the yield. The first electrode has a first region and a second region, and the first region of the first electrode has an electrical resistance larger than that of the second region of the first electrode.

In the quantum cascade laser according to an embodiment, the first electrode is ended on the first region of the semiconductor laminate, and is apart from the laminate end face.

In the quantum cascade laser according to an embodiment, the semiconductor substrate includes a first region and a second region arranged in the second direction, and the second region of the substrate includes the substrate end face. The second electrode has a first thickness in the first region and a second thickness in the second region, and the second thickness is smaller than the first thickness.

In the quantum cascade laser according to an embodiment, the substrate includes a first region and a second region arranged in the second direction, and the second electrode is ended on the first region of the substrate and is apart from the substrate end face.

In the quantum cascade laser according to an embodiment, the insulating film includes at least one of $SiO_2$, SiON, SiN, alumina, a BCB resin, or a polyimide resin. These materials can provide the insulating film of the quantum cascade semiconductor laser with an excellent durability and insulating properties, and allows the insulating film to work as a protective film for the laminate end face and the substrate end face. Films of the above materials can be formed on the laminate end face and the substrate end face using a dielectric film deposition, such as sputtering, CVD or spin coating. The process for forming the insulating film can be introduced into the process for fabricating a quantum cascade semiconductor laser.

In the quantum cascade laser according to an embodiment, the metal film includes an Au film. Using the Au film as the reflective film can provide the quantum cascade semiconductor laser with a high reflectance exceeding, for example, 90 percent at the laminated end face and the substrate end face.

In the quantum cascade laser according to an embodiment, the cladding layer includes InP. InP is a binary mixed crystal, which is lattice-matched to an InP base, which allows the satisfactory crystal-growth of the InP layer on the InP substrate. InP has an excellent thermal conductivity, and allows the cladding layer to dissipate heat from the core layer. Using InP for the cladding layer can provide the quantum cascade laser with excellent temperature characteristics.

In the quantum cascade laser according to an embodiment, the core layer includes active layers each working as a light emitting region and injection layers each enabling injection of carriers into the active layer, and the active layers and the injection layers are alternately arranged in the first direction. The alternate arrangement of the active and injection layers allows an injection layer in the core layer to continuously and smoothly inject electrons thereon into the active layer adjacent thereto and the adjacent active layer to emit light by subband transition in the conduction band, so that the cascading of the injection and the subband transition in the core allows the quantum cascade semiconductor laser to produce laser light, thereby enhancing the lasing characteristics In the quantum cascade laser according to an embodiment, each of the active layers and the injection layers includes a superlattice of GaInAs/AlInAs. The active and injection layers of GaInAs/AlInAs superlattices allow the core layer to lase in mid-infrared wavelengths (e.g., 3 to 20 micrometers) by means of electron transition between subbands in the conduction band.

The quantum cascade laser according to an embodiment, the semiconductor substrate includes an InP base. The quantum cascade semiconductor laser capable of producing light in mid-infrared region has a semiconductor laminate having lattice constants close to that of InP. Using an InP base as the semiconductor substrate allows the growth of the semiconductor laminate on the semiconductor substrate with excellent crystal quality. Further, the semiconductor substrate of InP, which is transparent to light in mid-infrared wavelengths, can function as a cladding layer.

Teachings of the present invention can be readily understood by considering the following detailed description with reference to the accompanying drawings shown as examples. Referring to the accompanying drawings, embodiments of a quantum cascade laser, and a method for fabricating a quantum cascade laser according to the present invention will be described below. To facilitate understanding, identical reference numerals are used, where possible, to designate identical elements that are common to the figures.

FIG. 1 is a perspective view showing a quantum cascade laser 1 according to an embodiment. For easy understanding, an XYZ coordinate system is depicted in FIG. 1, and in the present embodiment X-, Y-, and Z-axes are orthogonal to each other. The quantum cascade laser 1 may have a distributed feedback type (DFB), which allows the quantum cascade laser 1 to lase in a single mode, for example, in a mid-infrared wavelength region of 3 to 20 micrometers. As shown in FIG. 1, the quantum cascade laser 1 is mounted on a submount 3, which is located on a carrier 2, with a solder material 4. Specifically, the quantum cascade laser 1 is die-bonded to the submount 3 with the solder material 4 in an epi-up manner (with the epi-surface upward). The quantum cascade laser 1 has a lower electrode, which is electrically connected to the carrier 2 with the submount 3 and the solder material 4, and has an upper electrode, which is connected to an end of a wiring conductor 5 reaching a bonding pad to feed power to the quantum cascade laser 1. The upper electrode of the quantum cascade laser 1 is electrically connected to the pad electrode on the submount through the wiring conductor 5. The carrier 2 and the pad electrode are electrically connected to an external power supply. The application of a predetermined voltage from the external power supply between the upper and lower electrodes of the quantum cascade laser 1 turns on the quantum cascade laser 1 to cause current to flow into the quantum cascade laser 1, so that the quantum cascade laser 1 emits lasing light.

The carrier 2 has a width W1 in a range of, for example, 4 to 8 mm in the X direction and a length L1 in a range of, for example, 4 to 8 mm in the Y direction, and the carrier 2 has a thickness H1 in, for example, a range of 1 to 8 mm in the Z direction. The submount 3 has a length W2 in a range of, for example, 1 to 4 mm in the X direction and a length L2 in a range of, for example, 2 to 4 mm in the Y direction, and has a thickness H2 in a range of, for example, 0.1 to 0.5 mm in the Z direction. The submount 3 may include AlN or CuW, and the carrier 2 may include Cu or CuW. The solder material 4 may include AuSn, indium (In) or silver paste, and the wiring conductor 5 may include Au.

Figure 2:
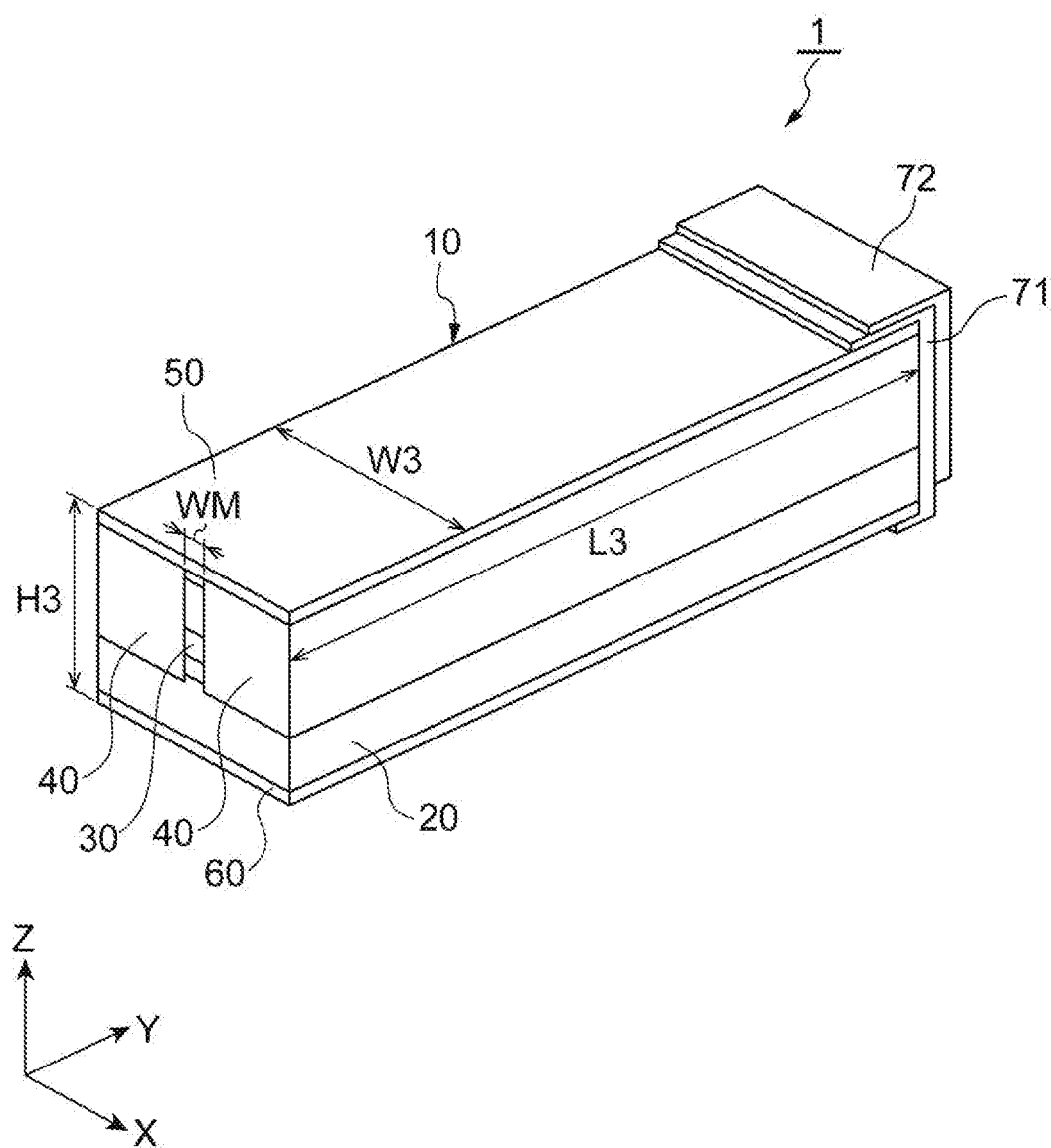
FIG. 2 is an enlarged perspective view showing the quantum cascade semiconductor laser as shown in FIG. 1.
Figure 3:
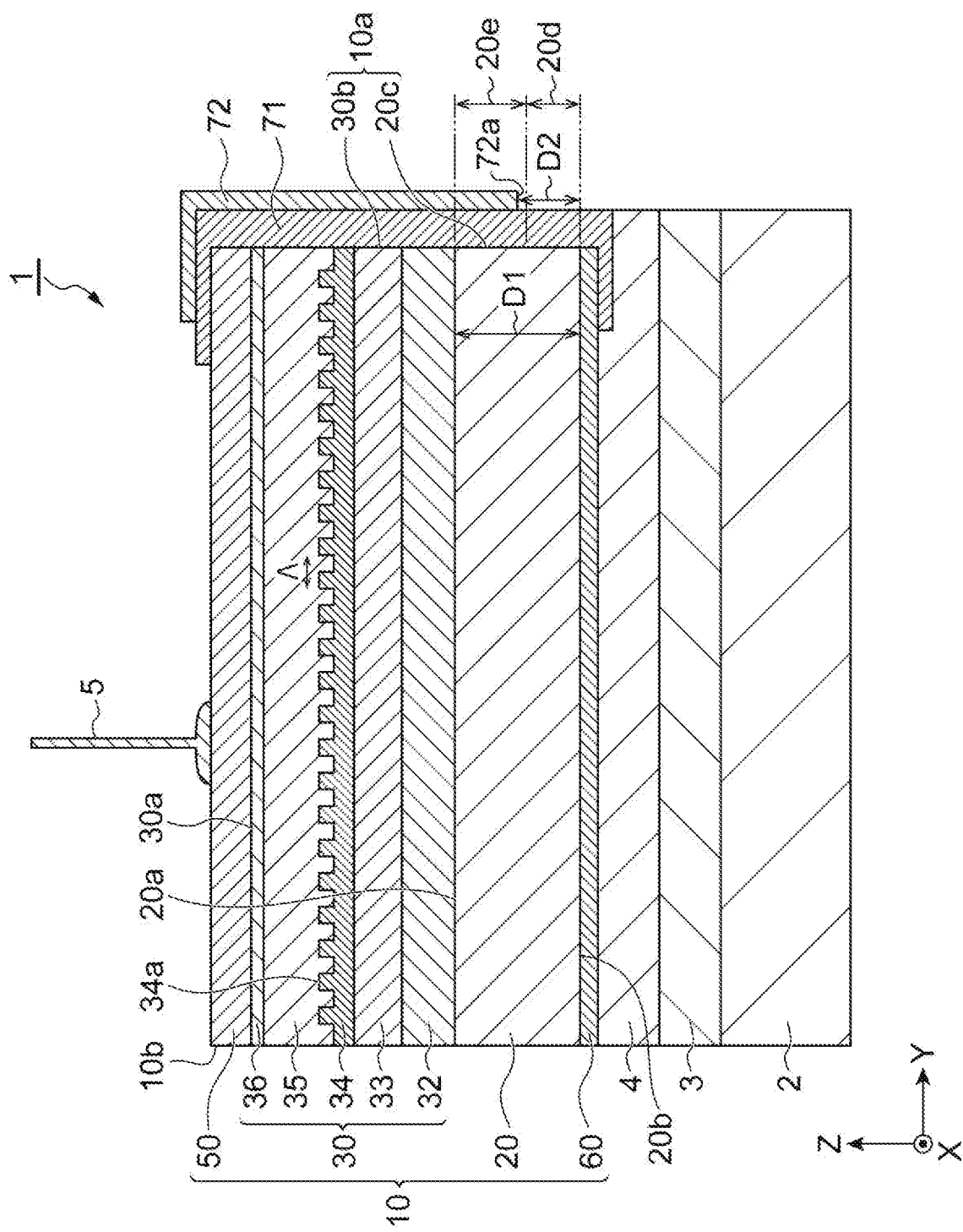
FIG. 3 is a cross-sectional view taken along line III-III shown in FIG. 1.

FIG. 2 is a perspective view showing the quantum cascade laser 1 shown in FIG. 1. FIG. 3 is a cross-sectional view taken along line III-III shown in FIG. 1. As shown in FIGS. 2 and 3, the quantum cascade laser 1 includes a semiconductor device portion 10, an insulating film 71, and a metal film 72 (a first metal film). The semiconductor device portion 10 has a buried-heterostructure (BH) enabling confinement of current, which is referred to as a current confinement structure. The semiconductor device portion 10 has a strip-shaped mesa, extending in a direction in which the waveguide mesa extends (e.g., in the Y direction). The semiconductor device portion 10 has a length L3 in a range of, for example, 1 to 3 mm in the Y direction; a length W3 in a range of, for example, 400 to 800 micrometers in the X direction; and a length H3 (the thickness of the semiconductor device portion 10) in a range of, for example, 100 to 200 micrometers. The semiconductor device portion 10 has a rear end face 10a and a front end face 10b, which are opposite to each other in the Y direction. Further, the semiconductor device portion 10 includes a semiconductor substrate 20, a semiconductor laminate 30, two current block portions 40, an upper electrode 50 (referred to as a first electrode), and a lower electrode 60 (referred to as a second electrode).

As shown in FIG. 3, the quantum cascade laser 1 is mounted on the submount 3 such that the semiconductor substrate 20 is bonded thereto with the solder material 4. The semiconductor substrate 20 may be, for example, an n-type InP substrate. The semiconductor substrate 20 is conductive to allow current to flow through the semiconductor laminate 30 in applying a voltage between the upper and lower electrodes 50 and 60. In order to allow the quantum cascade laser 1 to use electrons used as carrier, the semiconductor substrate 20 has an n-type conductivity. The semiconductor substrate 20 can work as a lower cladding region with respect to the core layer 33. Alternatively, the quantum cascade laser can have a lower cladding layer between the semiconductor substrate 20 and the core layer 33, and does not need the semiconductor substrate 20 that works as a lower cladding region. The semiconductor substrate 20 includes a principal surface 20a, a back surface 20b, and a substrate end face 20c. The principal and back surfaces 20a and 20b are opposite to each other (in the Z direction). The principal surface 20a, the back surface 20b of the semiconductor substrate 20, and the submount 3 are arranged in order, for example, in the Z direction. The semiconductor substrate 20 has a thickness of, for example, 100 micrometers in the Z direction (defined as a distance between the principal surface 20a and the back surface 20b) in the Z direction. The substrate end face 20c intersects an axis extending, for example, in the Y direction (the second direction), and connects the principal and back surfaces 20a and 20b. The substrate end face 20c is included by the rear end face 10a. The substrate end face 20c includes an lower area 20d (a first area) located close to the back surface 20b in the Z direction and an upper area 20e (a second area), which is disposed between the lower area 20d and the principal surface 20a, located away from the back surface 20b in the Z direction. The lower area 20d and the upper area 20e are arranged along an axis extending, for example, in the Z direction.

The semiconductor laminate 30 is disposed on the principal surface 20a of the semiconductor substrate 20. The semiconductor laminate 30 has an upper face 30a intersecting a direction of an axis, extending, for example, in the Z direction, a laminate end face 30b intersecting a direction of an axis extending, for example, in the Y direction, and a bottom face, which is in contact with the principal surface 20a and is opposite to the upper face 30a. The laminate end face 30b and the substrate end face 20c are arranged along a reference plane. The rear end face 10a includes the end face 30b of the semiconductor laminate 30 in addition to the substrate end face 20c. The semiconductor laminate 30 has a mesa shape. The semiconductor laminate 30 has a strip-shape extending, for example, in the Y direction, with a width WM defined in the X direction, and is located apart from the sides of the quantum cascade laser 1 in the X direction. The semiconductor laminate 30 includes end faces, which are opposite to each other in the Y direction, and side faces, which are opposite to each other in the X direction. The end faces of the semiconductor laminate 30, serving as mirrors, constitutes the laser cavity of the quantum cascade laser 1. One of the end faces is included in the laminate end face 30b. The semiconductor laminate 30 includes a buffer layer 32, a core layer 33, a diffraction grating layer 34, an upper cladding layer 35, and a contact layer 36, which are sequentially arranged on the semiconductor substrate 20.

The buffer layer 32 and the upper cladding layer 35 can be made of, for example, n-type InP. The buffer layer 32 works along with the semiconductor substrate 20 to provide a lower cladding region for the core layer 33. The upper cladding layer 35 is disposed on the core layer 33 and the diffraction grating layer 34, which is between the core layer and the upper cladding layer. If needed, the semiconductor laminate 30 uses the buffer layer 32, and the core layer 33 is disposed directly on the principal surface 20a of the semiconductor substrate 20. The core layer 33 extends from the laminate end face 30b along a direction of an axis extending in the Y direction. The core layer 33 includes multiple unit structures. The unit structures are arranged in the direction of an axis along which the core layer and the upper cladding layer are arranged (the Z direction), thereby forming an array, and the adjoining unit structures in the array are in contact with each other. The array may include, for example, several tens of unit structures. The unit structures each include quantum well layers (several-nanometer thick) and barrier layers (several-nanometer thick), which are alternately arranged to form a superlattice, for example, in the Z direction. The quantum well layers each can include GaInAs or GaInAsP, and the barrier layers each can include AlInAs. Each unit structure is composed of an active layer and an injection layer. The active layers each work as a light emitting region to emit light. The injection layers each can deliver carriers into the adjacent active layer. The active layers and the injection layers are stacked along the Z direction to form a superlattice made of GaInAs/AlInAs.

The mechanism of optical emission of the quantum cascade laser 1 will be briefly described. The quantum cascade laser 1 uses a single kind of carriers, such as electrons, to emit light caused by optical transition of electrons between subbands of the conduction band in the active layers. The light produced by the emission is amplified in the lasing cavity of the quantum cascade laser 1, whereby the quantum cascade laser 1 emits laser light in a mid-infrared wavelength region. Specifically, the quantum cascade laser 1 has the following three-level system in the conduction band in the active layer. First, an injection layer injects electrons into the upper level of the active layer by tunneling. These electrons transition from the upper to lower levels of the active layer. This transition creates light having a wavelength of energy equal to its transition energy (the energy difference between the upper and lower levels of the subbands). The electrons in the lower level further makes a non-radiative transition to the bottom level in a short relaxation time by use of LO phonon scattering. As seen from the above description, the energy difference between the lower and bottom levels is designed to allow LO phonons to resonantly scatter the electrons. The non-radiative transition of electrons to the bottom level in a short relaxation time produces an inverted population of electrons between the upper and lower levels in the active layer. The electrons thus relaxed to the bottom level drift to the upper level of the active layer in the next stage by an electric field through the injection layer therebetween. Subsequently, the core layer in the quantum cascade laser 1 repeats the same transitions, for example, several tens of times in the core layer to obtain the gain necessary for lasing. The quantum cascade laser 1 uses the quantum well layers and the barrier layers with their thicknesses and their material compositions appropriately selected to allow the adjustment of the energy difference between the upper and lower levels, for example, in the range of 3 to 20 micrometers for lasing in the infrared region.

As shown in FIG. 3, the diffraction grating layer 34 has a diffraction grating 34a with a periodic surface structure of a period A, which has recesses and ridges alternately arranged in the Y direction. The diffraction grating 34a is formed as follows: forming a patterned resist of a period A on a film for the diffraction grating layer 34; and etching the film for the diffraction grating layer 34 with the patterned resist to form recesses and ridges, periodically arranged in the Z direction, for the diffraction grating. The diffraction grating of the period A can selectively reflect light of a wavelength equivalent to the period A, i.e., the Bragg wavelength, and the light thus reflected selectively is amplified by the lasing cavity, leading to lasing in the quantum cascade laser 1 in a single mode at the Bragg wavelength. The performance of the diffraction grating layer 34 is represented by a coupling coefficient indicating the magnitude of coupling between guided light components going forward and backward in the lasing cavity. The diffraction grating 34a with a large coupling coefficient allows the quantum cascade laser 1 to satisfactorily produce a single-mode laser beam. The diffraction grating layer 34 is provided with semiconductor having a high refractive index, such as undoped or n-type GaInAs, to enable a large coupling coefficient.

Note that, if needed, the semiconductor laminate 30 includes the contact layer 36, and otherwise a contact between the upper cladding layer 35 and the upper electrode 50 can provide a good ohmic contact. The contact layer 36 makes good ohmic contact with the upper electrode 50. The contact layer 36 is made of material having a small bandgap and lattice-matched to the semiconductor substrate 20 to enable good ohmic contact. The contact layer 36 is made of, for example, n-type GaInAs.

As shown in FIG. 2, the semiconductor laminate 30 is embedded by the two current blocking portions 40 on both side faces thereof, and the current blocking portions 40 function as a current confinement layer constricting current (carriers) in the semiconductor laminate 30. The two current block portions 40 are disposed on the principal surface 20a of the semiconductor substrate 20 to cover both side faces of the semiconductor laminate 30. Each current block portion 40 includes undoped or semi-insulating semiconductor. These undoped and semi-insulating semiconductors have high electrical resistance, which is suitable for material of the current block portion 40, to carriers, such as electrons. The addition of a transition metal, such as Fe, Ti, Cr, and Co (dopant), to III-V compound semiconductor forms deep levels, which can trap electrons, in the forbidden band to provide host semiconductor with a semi-insulating property. III-V compound semiconductor doped with the transition metal has a specific resistance of, for example, $10^5$ Ωcm or more to electrons, which is sufficiently high electric. Iron (Fe) is an excellent transition metal to enable the semi-insulating property. An undoped semiconductor with a sufficiently high electric resistance to electrons can be used for the current block portions 40. Undoped or semi-insulating III-V compound semiconductor encompasses InP, GaInAs, AlInAs, GaInAsP, and/or AlGaInAs. These semiconductors are lattice matched to the semiconductor substrate 20, and are grown by a growth method, such as molecular beam epitaxy (MBE) and metalorganic vapor phase epitaxy (OM-VPE).

The upper and lower electrodes 50 and 60 are arranged to supply current to the core layer 33. The upper and lower electrodes 50 and 60 each include, for example, Ti/Au, Ti/Pt/Au, or Au/Ge. The upper electrode 50 works as, for example, a cathode electrode, and is disposed on the upper face 30a of the semiconductor laminate 30 (specifically, on the contact layer 36) and the current block portions 40. The lower electrode 60 works as, for example, an anode electrode, and is disposed on the back surface 20b of the semiconductor substrate 20 and is in contact with the solder material 4. The lower electrode 60 receives a positive potential with respect to the upper electrode 50.

If needed, an optical confinement layer may be disposed between the core layer 33 and the semiconductor substrate 20 and/or between the core layer 33 and the upper cladding layer 35. The optical confinement layer has a bandgap smaller than the bandgaps of the semiconductor substrate 20 and the upper cladding layer 35, and larger than that of the core layer 33. The optical confinement layer does not block electrons, which are efficiently injected from the buffer layer 32 to the core layer 33 therethrough. This magnitude relationship of these bandgaps allows the optical confinement layer each to have a refractive index larger than refractive indices of the semiconductor substrate 20 and the upper cladding layer 35, and smaller than that of the core layer 33. The semiconductor substrate 20 and the upper cladding layer 35, therefore, work to confine light, which is produced by the core layer 33, into the core layer 33 and the optical confinement layer, thereby enhancing the confinement of light into the core layer 33. In order to enhance confinement of light into the core layer 33, the optical confinement layer can be made of material that has a refractive index higher than the refractive indices of the semiconductor substrate 20 and the upper cladding layer 35 and is lattice matched to the semiconductor substrate 20. The optical confinement layer may include, for example, undoped or n-type GaInAs.

The insulating film 71 is disposed adjacent to the rear end face 10a of the semiconductor device portion 10. Specifically, the insulating film 71 has a thick portion disposed on the rear end face 10a and upper and lower thin portions which extend from the thick portion along the upper and lower electrodes 50 and 60, respectively. More specifically, the laminate end face 30b and the substrate end face 20c are entirely covered with the thick portion of the insulating film 71, and the upper and lower electrodes 50 and 60 have end portions, which are covered with the upper and lower thin portions of the insulating film 71, close to the rear end face 10a. The thick portion of the insulating film 71 has a thickness, which is defined as a thickness in the Y direction, on the rear face 10a larger than thicknesses, defined as a thickness in the Z direction, of the upper and lower portions of the insulating film 71, which are on the upper and lower electrodes 50 and 60, respectively. For example, the insulating film 71 has a thickness in a range of 100 to 200 nm on the rear facet 10a, and the insulating film 71 has respective thicknesses on the upper and lower electrodes 50 and 60 in a range of 20 to 30 nm in the Z direction. The insulating film 71 is made of dielectric film including at least one of $SiO_2$, SiON, SiN, $Al_2O_3$ (alumina), BCB resin, or polyimide resin.

The metal film 72 is provided on the laminate end face 30b, which is on the insulating film 71, and extends from the laminate end face 30b along the upper electrode 50. The metal film 72 has an edge 72a, which is located in the upper area 20e and apart from the lower area 20d of the substrate end face 20c, in the Z direction and extends on the upper area 20e in the X direction. The metal film 72 covers the laminate end face 30b and the end, close to the rear end face 10a, of the upper electrode 50, in addition to the upper area 20e, and extends from the edge 72a of the metal film 72 toward the principal surface 20a, e.g., to the upper electrode in the Z direction. All the metal films (including the metal film 72) of the quantum cascade laser 1 are not disposed on the lower electrode 60 and the lower area 20d. The metal film 72 covers at least a part of the laminate end face 30b, and may cover a part of the substrate end face in addition to the laminate end face 30b.

Further, the distance, taken in the Z direction, from the back surface 20b to the principal surface 20a (i.e., the thickness of the semiconductor substrate 20) is referred to as D1, and the distance, taken in the Z direction, from the back surface 20b to the position of the edge 72a of the metal film 72 is referred to as D2. The metal film 72 is provided with the edge 72a positioned so as to satisfy the relation of D1>D2, which indicates that D1 is greater than D2. Further, the relationship of D1−D2>5 micrometers is satisfied, and furthermore the relationship of D1−D2>10 micrometers may be satisfied. The metal film 72 has an edge, which is on the upper electrode 50, closer to the rear end face 10a than that of the insulating film 71 on the upper electrode 50 in the Y direction, and the edge of the metal film 72 is set back with respect to the edge of the insulating film 71. The difference between these the edges can prevent the metal film 72 from being in direct contact with the upper electrode 50. The metal film 72 has a thickness, defined in the Y direction, on the rear face 10a smaller than a thickness, defined in the Z direction, of the metal film 72 on the upper electrode 50. The metal film 72 includes, for example, Au, and has a high reflectance of, for example, not less than 90%.

Figure 5A:
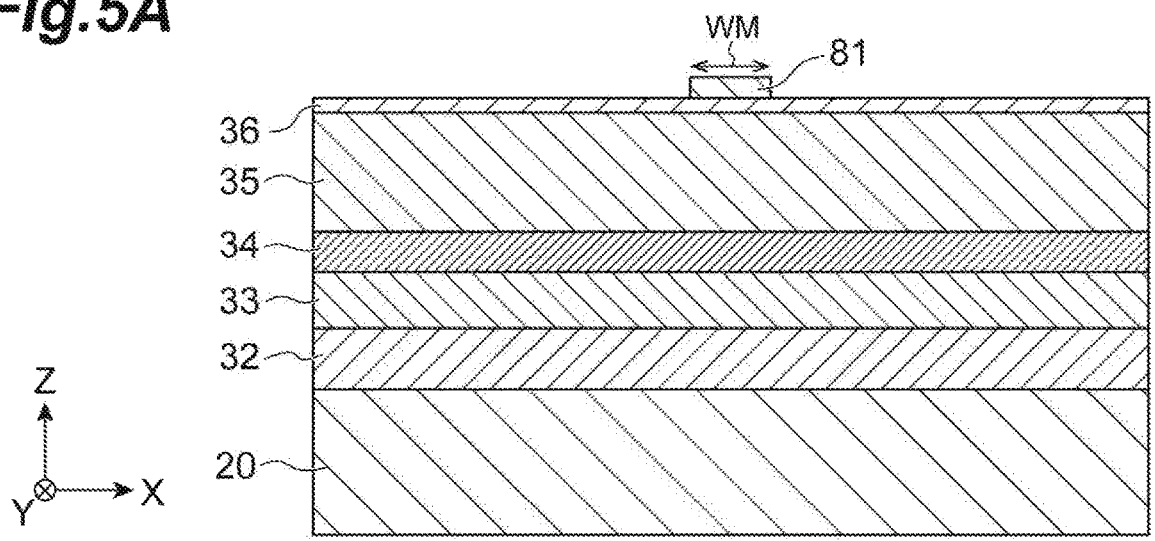
FIG. 5A is a schematic view showing a major process in the method according to the embodiment.
Figure 5B:
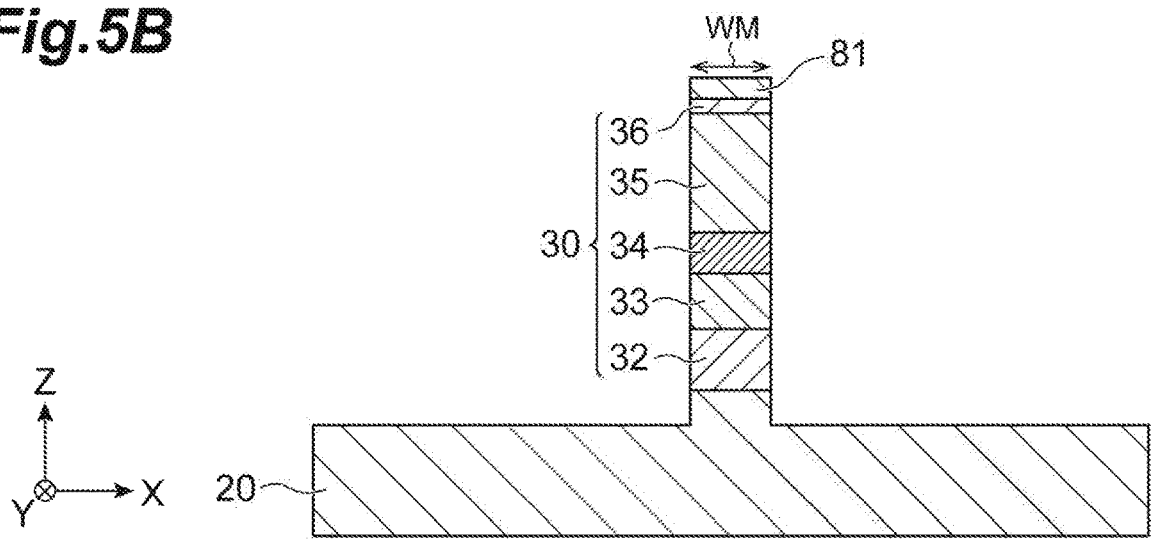
FIG. 5B is a schematic view showing a major process in the method according to the embodiment.
Figure 5C:
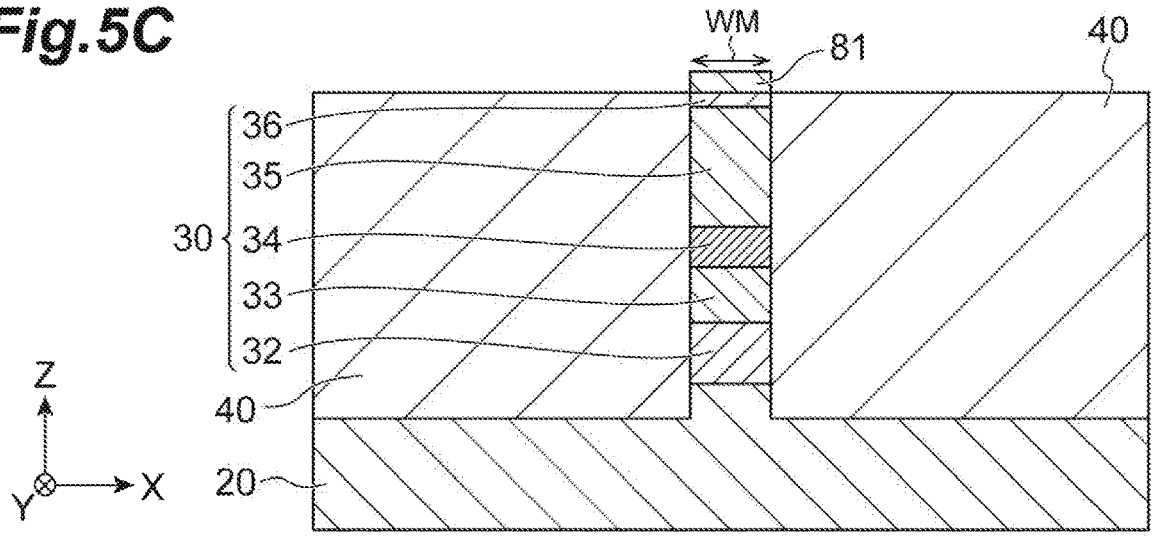
FIG. 5C is a schematic view showing a major process in the method according to the embodiment.

A description will be given of the method for fabricating the quantum cascade laser 1 that has the above structure. FIGS. 4A to 4C, FIGS. 5A to 5C, FIG. 6, FIGS. 7A and 7B, and FIGS. 8A and 8B are schematic views each showing a major process in a method for fabricating the quantum cascade laser 1 shown in FIG. 1. FIGS. 4A to 4C and FIG. 6 are cross sectional views, each taken along a line equivalent to line III-III of FIG. 1 and parallel to the YZ plane, and FIGS. 5A to 5C are cross sectional views, each taken along a plane parallel to the YZ plane. First, a wafer is prepared which will be the semiconductor substrate 20 in a later process. Then, in a first crystal growth step, the buffer layer 32, the core layer 33, and the diffraction grating layer 34 are grown in order on the principal surface of the wafer by a growth method, such as MBE and OMVPE, to form an epi-wafer. Thereafter, a resist mask 80 is formed on the epi-wafer by photolithography on the diffraction grating layer 34. As shown in FIG. 4A, the resist mask 80 has a pattern for the diffraction grating 34a. The pattern of the resist mask 80 has a width of A in the Y direction. The epi-wafer is etched with the resist mask 80 in the Z direction to form the diffraction grating 34a with a periodic structure as shown in FIG. 4B in the diffraction grating layer 34.

In a second crystal growth step, as shown in FIG. 4C, the upper cladding layer 35 and the contact layer 36 are grown in order on the diffraction grating layer 34. Next, as shown in FIG. 5A, a mask 81 defining the semiconductor laminate 30 is formed on the contact layer 36 by photolithography. The mask 81 has a pattern of a predetermined width WM, which is defined in the X direction, extending in the Y direction in each of device sections for the quantum cascade laser 1, and the pattern is apart from the boundaries between the device sections in the X direction. The mask 81 may include the same material as that of the insulating film 71, and specifically, be mode of a dielectric material containing at least one of SiN, SiON, alumina, and $SiO_2$.

An etching process with the mask 81 forms the semiconductor laminate 30, which has a mesa-shape as shown in FIG. 5B. The etching may include dry etching and/or wet etching, and the dry etching can be used to form the semiconductor laminate 30. The dry etching can provide the semiconductor laminate layer 30 of the predetermined width WM with excellent verticality and high accuracy. The dry etching greatly affects the device characteristics of the quantum cascade laser 1. The dry etching may be, for example, reactive ion etching (RIE), and the reactive ion etching (RIE) uses plasma of etching gas.

Figure 6:
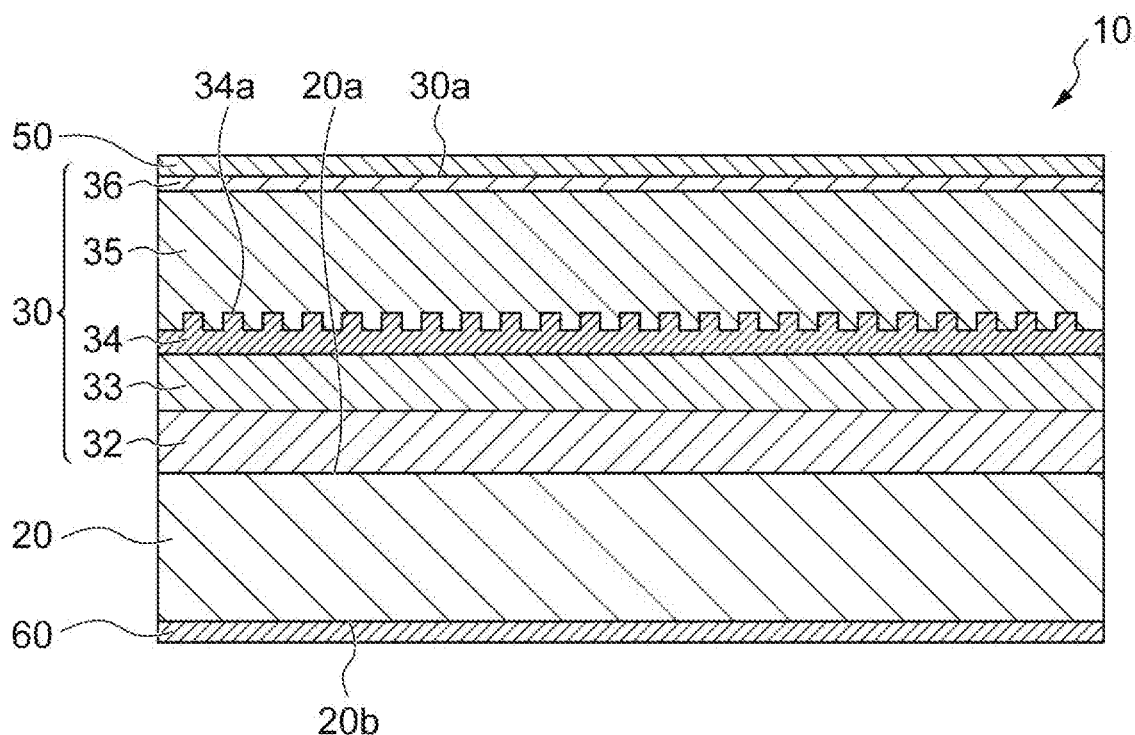
FIG. 6 is a schematic view showing a major process in the method according to the embodiment.

In a third crystal growth step, a semi-insulating semiconductor layer, such as InP doped with Fe, is grown with the mask 81 left on the semiconductor laminate 30. As shown in FIG. 5C, deposited material is less formed on the mask 81, and the semi-insulating semiconductor layer is grown on both sides of the semiconductor laminate 30 (in recesses formed by etching in FIG. 5B) so as to embed the semiconductor laminate 30. These two current block portions 40 are formed to embed the semiconductor laminate 30. After removing the mask 81, as shown in FIG. 6, the upper electrode 50 is formed on the upper face 30a of the semiconductor laminate 30. After forming the upper electrode, the wafer is thinned by polishing to a thickness allowing the cleavage of the wafer (for example, 100 to 200 micrometers), and then as shown in FIG. 6, the lower electrode 60 is formed on the back surface 20b of the thinned semiconductor substrate 20.

Figure 7A:
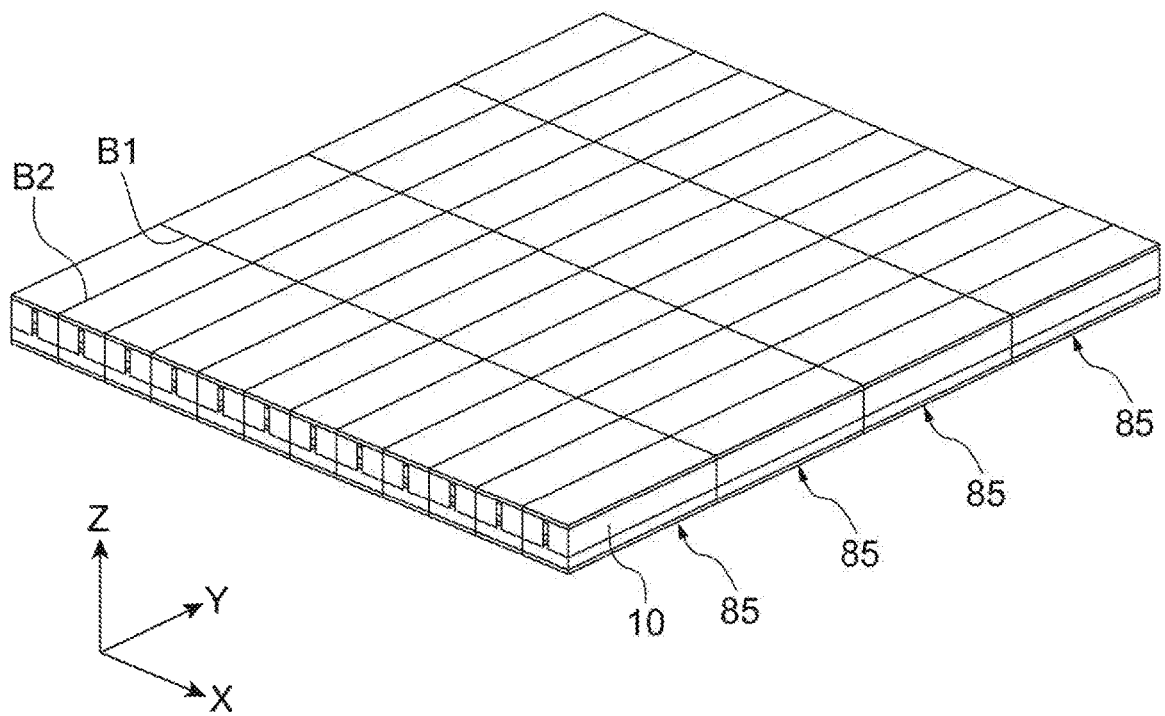
FIG. 7A is a schematic view showing a major process in the method according to the embodiment.
Figure 7B:
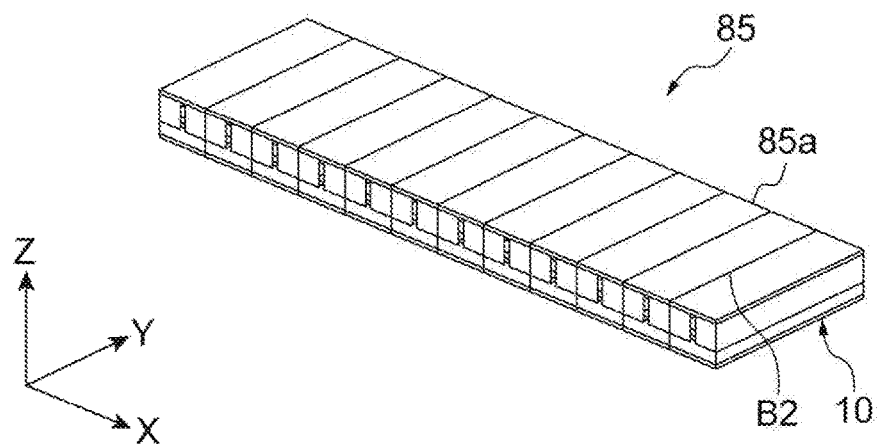
FIG. 7B is a schematic view showing a major process in the method according to the embodiment.

The above processes bring a wafer product to completion. FIG. 7A shows a wafer product having an array of the device sections for the semiconductor device portions 10 of the multiple quantum cascade lasers 1 which are arranged in the X and Y directions over the entire wafer. In FIG. 7A, boundary lines B1 and B2 between the device sections are depicted and the wafer product are divided along the lines B1 and B2 to form the multiple semiconductor device portions 10. Specifically, the boundary line B1 extends in the X direction and the boundary line B2 extends in the Y direction. Then, the wafer product is separated by cleavage at the boundary line B1 into chip-bars each having the arrangement of the multiple device sections for the semiconductor device portions 10, e.g. a chip-bar 85 as shown in FIG. 7B. The chip-bar 85 includes the multiple semiconductor device sections arranged along the X direction. The chip-bar 85 has an end face 85a including the rear end faces 10a of the quantum cascade lasers 1 arranged in the X direction.

Figure 8A:
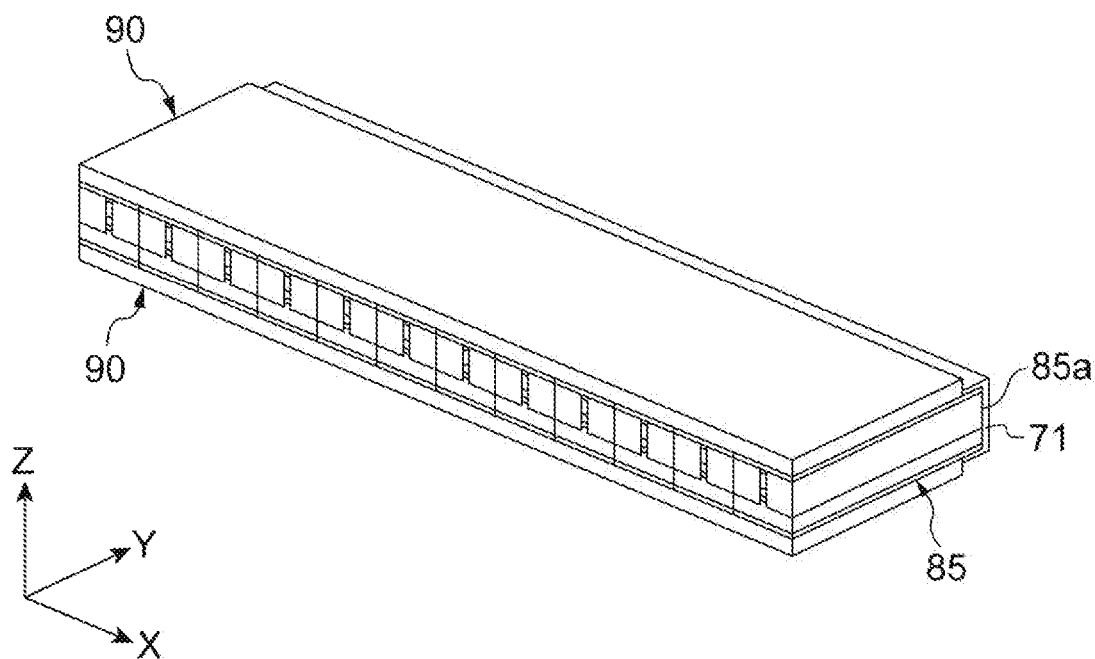
FIG. 8A is a schematic view showing a major process in the method according to the embodiment.

A description will be given of a process of forming the insulating film 71 on the end face 85a. First, as shown in FIG. 8A, two protectors 90 are prepared in order to form the insulating film 71 on a desired area of the chip bar 85, and the desired area includes the end face 85a of the chip bar 85. The protectors 90 each may have a thin plate of a rectangle, the longitudinal of which is oriented to the X direction as shown in FIG. 8A. One protector 90 is used to cover, except for the near zone of the upper electrode 50 close to the end face 85a of the chip bar 85, almost all the upper electrode 50, i.e., the far zone, and not to cover any end face 85a. The one protector 90 has an end, which is located at the boundary between the near and far zones of the upper electrode 50, and the near and far zones are arranged in the Y direction. Another protector 90 is used to cover, except for the near zone of the lower electrode 50 close to the end face 85a of the chip bar 85, almost all the lower electrode 60, i.e., the far zone, and not to cover any end face 85a. The other protector 90 has an end, which is located at the boundary between the near and far zones of the lower electrode 60, and the near and far zones are arranged in the Y direction. After attaching these protectors 90 to the chip-bar, an insulating film 71 is formed on the end face 85a. Specifically, flux containing constituent atoms for the insulating film 71 is supplied to the end face 85a, and the constituent atoms are deposited on the end face 85a, for example, by CVD or sputtering to form the film. The constituent atoms fly toward the end face 85a in the normal direction of the end face 85a. At this time, the constituent atoms that miss the end face 85a fly along both the upper and lower electrodes 50 and 60, and are deposited on parts of the upper and lower electrodes 50 and 60 included in the near zone of the chip bar 85, thereby forming the insulation film 71. The insulating film 71 is formed in the end face 85a and the near zone of the chip bar 85 to form a second wafer product. After forming the insulation film 71, the protectors 90 are detached from the chip-bar.

Figure 8B:
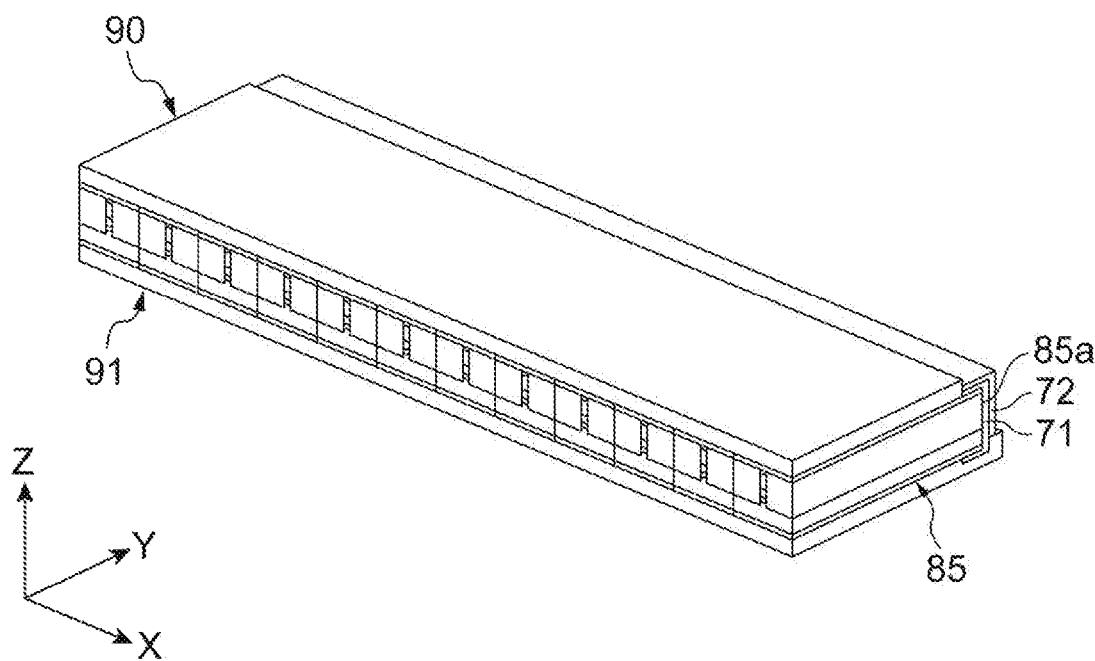
FIG. 8B is a schematic view showing a major process in the method according to the embodiment.

A description will be given of a process of forming the metal film 72 on the end face 85a. First, as shown in FIG. 8B, another protector 91 is prepared. The other protection member 91 has a first portion of a plate-like shape and a second portion of a plate-like shape, the ends of which are connected to each other, and the first portion extends in the X direction along its longitudinal direction to provide the other protector with an L-shape in cross section taken along the plane intersecting the X direction. The other protector 91 is used in place of the protector 90, and covers the entire lower electrode 60 with the first portion thereof, and the part, which is close to the lower electrode 60, of the end face 85a, i.e., the area 20d with the second portion thereof. After attaching the protection member 90 and the other protection member 91 to the chip bar 85 having the insulating film 71 thereon, a metal film 72 is formed on the insulating film 71 on the end face 85a. The second portion of the other protector 91, i.e., the bent portion of the L-shape, covers the lower area, close to the lower electrode 60 in the Z direction, of the end face 85a, so that the metal film 72 thus deposited has an edge 72a at the position of the tip of the L-shaped bent portion. Specifically, electron beam evaporation is used to deposit constituent atoms for the metal film 72 on the end face 85a. This evaporation can form the metal film 72 on the insulating film 71, which covers the upper electrode 50 in the near zone of the chip bar 85. The metal film 72 is formed on a part of the end face 85a and the near zone of the chip bar 85 on the upper electrode 50.

The protector 90 for forming the metal film 72 has a length in the Y direction longer than that of the protector 90 for forming the insulating film 71 in the Y direction. The edge of the metal film 72 is positioned closer to that of the insulating film 71 on the upper electrode 50 with respect to the end face 85a in the Y direction, so that the difference in position between these edges can prevent the metal film 72 from being in direct contact with the upper electrode 50 to form a short circuit path. After forming both the insulating film 71 and the metal film 72, the chip bar 85 thus formed is broken along the boundary line B2 by cleavage (referring to FIG. 7B) into the quantum cascade lasers 1 as shown in FIG. 1.

A description will be given of advantageous effects of the quantum cascade laser 1 according to the above-described embodiment. A quantum cascade laser is a promising light source that can be used in technical fields, such as environmental gas analysis, medical diagnosis, and industrial processing. The quantum cascade laser produces a lasing light beam in mid-infrared wavelengths (for example, a wavelength range of 3 to 30 micrometers). Quantum cascade lasers can be light sources that offer a reduction in size and cost, and are now being developed. Particularly, in the field of gas sensing, which is promising in the mid-infrared wavelengths, single-mode DFB quantum cascade lasers in the mid-infrared become the mainstream of the development because they can provide light for use in detecting an absorption line of a specific gas. Such a quantum cascade laser incorporates, in principle, the occurrence of non-radiative recombination due to LO phonon scattering, which increase the threshold current of the lasing to several hundred of mA to several amperes, so that the quantum cascade laser consumes a large amount of power. The increase in the threshold current is one of the reasons to hinder the practical use of the quantum cascade laser. In order to suppress the increase in the threshold current, the quantum cascade laser can be provided with the lasing cavity including a metal film on the end face thereof.

Figure 9:
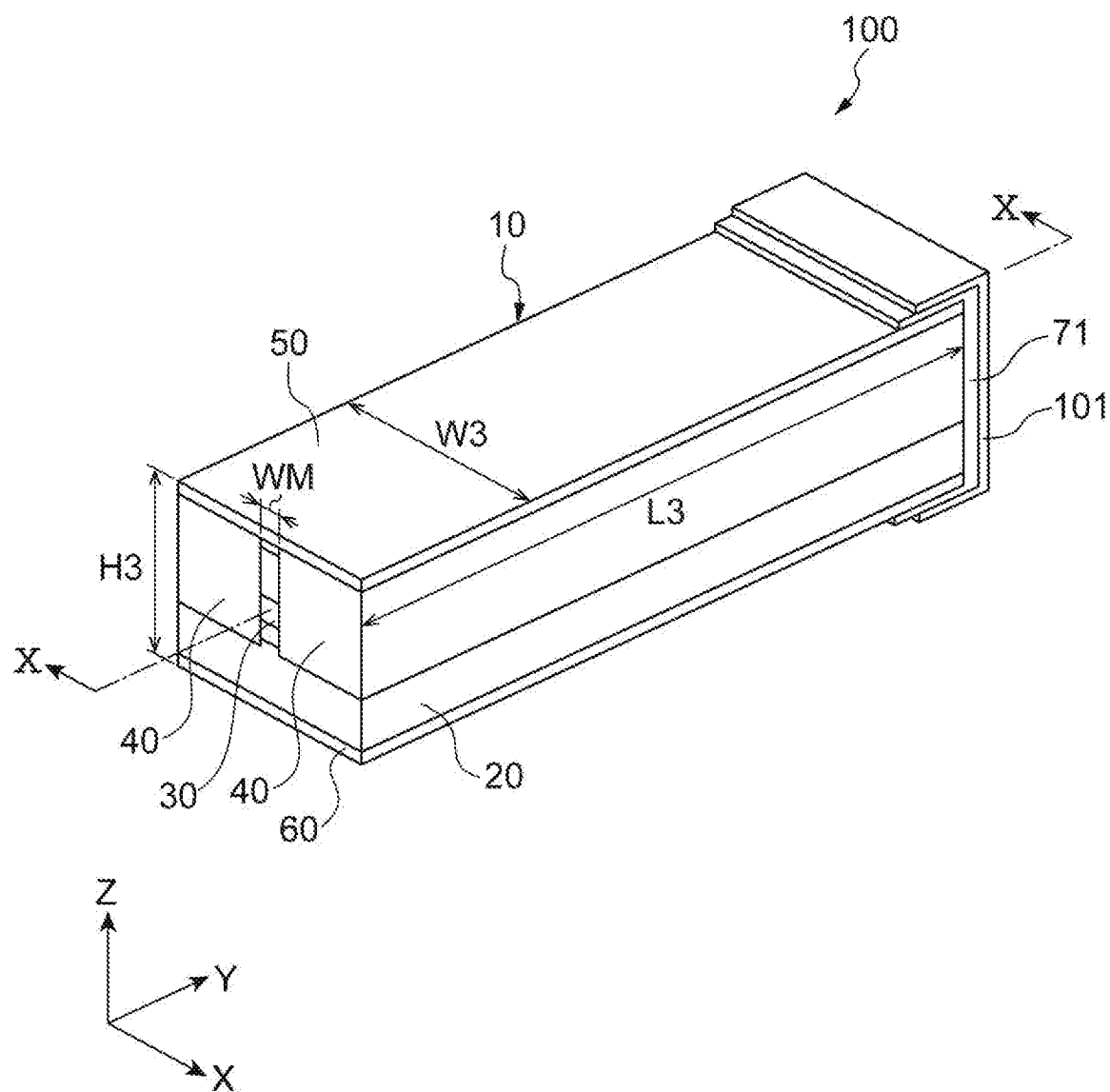
FIG. 9 is a perspective view showing another quantum cascade semiconductor laser.
Figure 10:
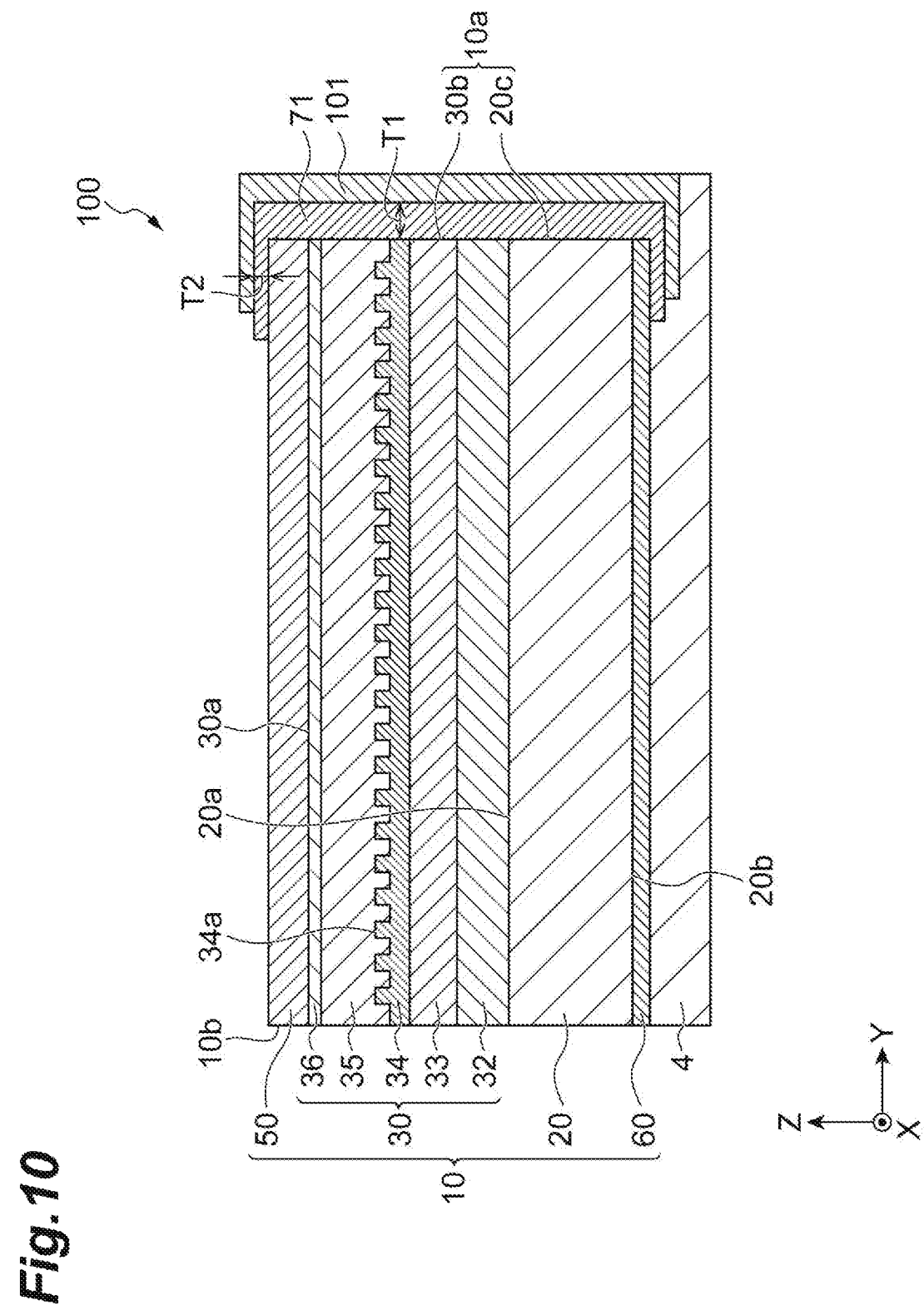
FIG. 10 is a cross-sectional view taken along line X-X shown in FIG. 9.

A description will be given of the structure of a quantum cascade laser having a metal film on the end face thereof. FIG. 9 is a perspective view showing the quantum cascade laser 100. FIG. 10 is a cross-sectional view taken along line X-X shown in FIG. 9. For easy understanding, an XYZ coordinate system is depicted in each figure, and in the present embodiment, X-, Y-, and Z-directions are orthogonal to each other. Please note that, in order to show a conductive path through the solder material, FIG. 10 shows not only the quantum cascade laser 100 but also the solder material 4, which is used in mounting the quantum cascade laser 100 on a submount. The quantum cascade laser 100 has a buried-heterostructure similar to that of the quantum cascade laser 1 of the present embodiment. As shown in FIG. 9, the quantum cascade laser 100 includes a semiconductor device portion 10, an insulating film 71, and a metal film 101.

The difference in shape between the metal film 101 and the metal film 72 according to the present embodiment is that the metal film 101 extends from the rear end face 10a to the lower electrode 60 via the insulating film 71. Mounting the quantum cascade laser 100, which has the metal film 101, on the submount with the solder 4 causes the metal film 101 on the lower electrode 60 to make contact with the solder material 4. The application of an external voltage (for example, a high voltage of 10 volts or more) between the upper and lower electrodes 50 and 60 that enables laser oscillation in the quantum cascade laser 100 results in the application of the voltage thus applied on the lower electrode 60 to the metal film 101 via the solder material 4. The external voltage, consequently, is applied to the insulating film 71 between the upper electrode 50 and the metal film 101 on the upper electrode 50.

As described above, the insulating film 71, however, has a thickness T2 on the upper electrode 50 extremely thinner than the thickness Ti of the insulating film 71 on the rear end face 10a. The above high voltage of, for example, 10 volt or more may be applied to the insulating film 71, disposed between the upper electrode 50 and the metal film 101, to cause breakdown of the insulating film 71. This breakdown may from a current path in the insulating film 71, which allows a large amount of current (that is, inrush current) to flow in the vicinity of the rear end face 10a therethrough, so that the quantum cascade laser 100 may be subject to failure, such as breakage at an end face. Making an insulating film on the upper electrode 50 thick provides the resultant insulating film on the rear end face 10a with a large thickness (for example, several times thicker than before). Forming this thick film increases deposition time to form the insulating film 71 on the rear face 10a (for example, several times longer), thereby reducing the productivity of the quantum cascade laser 100. An insulating film with such a large thickness makes stress to the rear end face 10a large, and this stress may cause deterioration of the rear end face 10a, such as cracking of the insulating film 71, peeling-off from the rear end face 10a.

In contrast, as shown in FIG. 3, the quantum cascade laser 1 according to the present embodiment, which provides the metal film 72 with the edge 72a on the area 20e of the substrate end face 20c and provides the substrate end face 20c with the area 20d between the metal film 72 and the back surface 20b, can prevent the metal film 72 from making contact with the solder material 4, allowing electrical insulation of the metal film 72, the lower electrode 60 and the solder material 4 from each other. In the above-described quantum cascade laser 1, the electrical insulation can prevent the application of the voltage to the insulating film 71 disposed between the upper electrode 50 and the metal film 72 on the upper electrode 50, and no application of the voltage avoids the breakdown of the insulating film 71. No breakage of the insulating film 71 leads to no destruction of the end face, thereby suppressing degradation of the device characteristics of the quantum cascade laser 1. All or a partial coating of the laminate end face 30b, which acts as the laser cavity of the quantum cascade laser 1, allows the metal film 72 to reflect guided light. The metal film 72 enabling the high reflection can improve the device performance of the quantum cascade laser 1 (in particular, can reduce the threshold current).

In addition, as in the present embodiment, the insulating film 71 may include at least one of SiO$_2$, SiON, SiN, alumina, BCB resin, and polyimide resin, each of which have excellent durability and insulating properties for use in a protective film for the rear end face 10a. Further, these dielectric films are provided by a familiar method, such as sputtering, CVD, or spin coating, easily formed on the rear face 10a. Using one of these methods makes introduction of the deposition of the insulating film 71 into the fabricating process of the quantum cascade laser 1 easy.

In the present embodiment, the metal film 72 may include Au. Au can provide the metal film 72 on the rear facet 10a with a high reflectivity of, for example, more than 90 percent.

In the present embodiment, the upper cladding layer 35 may include an InP layer. InP is transparent (no absorption of light) to lasing light in the mid-infrared wavelengths, and can be suitable as material of the upper cladding layer 35. InP also is a binary mixed crystal, which is lattice-matched to the semiconductor substrate 20 of InP, so that an InP layer can be satisfactorily grown on the InP substrate. Further, InP has an excellent thermal conductivity, and can dissipate heat from the core layer 33 through the upper cladding layer 35 satisfactorily. This excellent thermal conductivity can provide the quantum cascade laser 1 with excellent temperature characteristics.

In the present embodiment, the core layer 33 includes multiple active layers enabling light emission, and multiple injection layers enabling injection of carriers into the adjacent active layer, and the active layers and the injection layers are arranged in the Z direction. Providing the injection layer between the active layers as above allows electrons thus optically-transitioned in the upstream active layer to continuously and smoothly move to the downstream active layer, and the transmission of electrons can generate light emission between the subbands in the conduction band in the active layer. The core layer 33 can provide the quantum cascade laser 1 with excellent lasing characteristics.

In the present embodiment, the active layers and the injection layers each may include an array of GaInAs/AlInAs superlattices. The superlattice for the active layer can provide transitions between subbands of electron in the conduction band of the active layer, and the subband transition allows optical emission of mid-infrared wavelength (e.g., 3 to 20 micrometers). The quantum cascade laser 1 provides the core layer 33 with material allowing lasing of a wavelength in the mid-infrared wavelengths.

In the present embodiment, the semiconductor substrate 20 may be an InP base. The semiconductor laminate 30 of the quantum cascade laser 1 has a lattice constant close to that of InP. Using the InP base for the semiconductor substrate 20 allows the growth of the semiconductor laminate 30 on the semiconductor substrate 20 with an excellent crystal quality. InP is transparent to light in the mid-infrared wavelengths, so that the InP substrate can work as a lower cladding layer for the core layer 33.

(First Modification)

Figure 11:
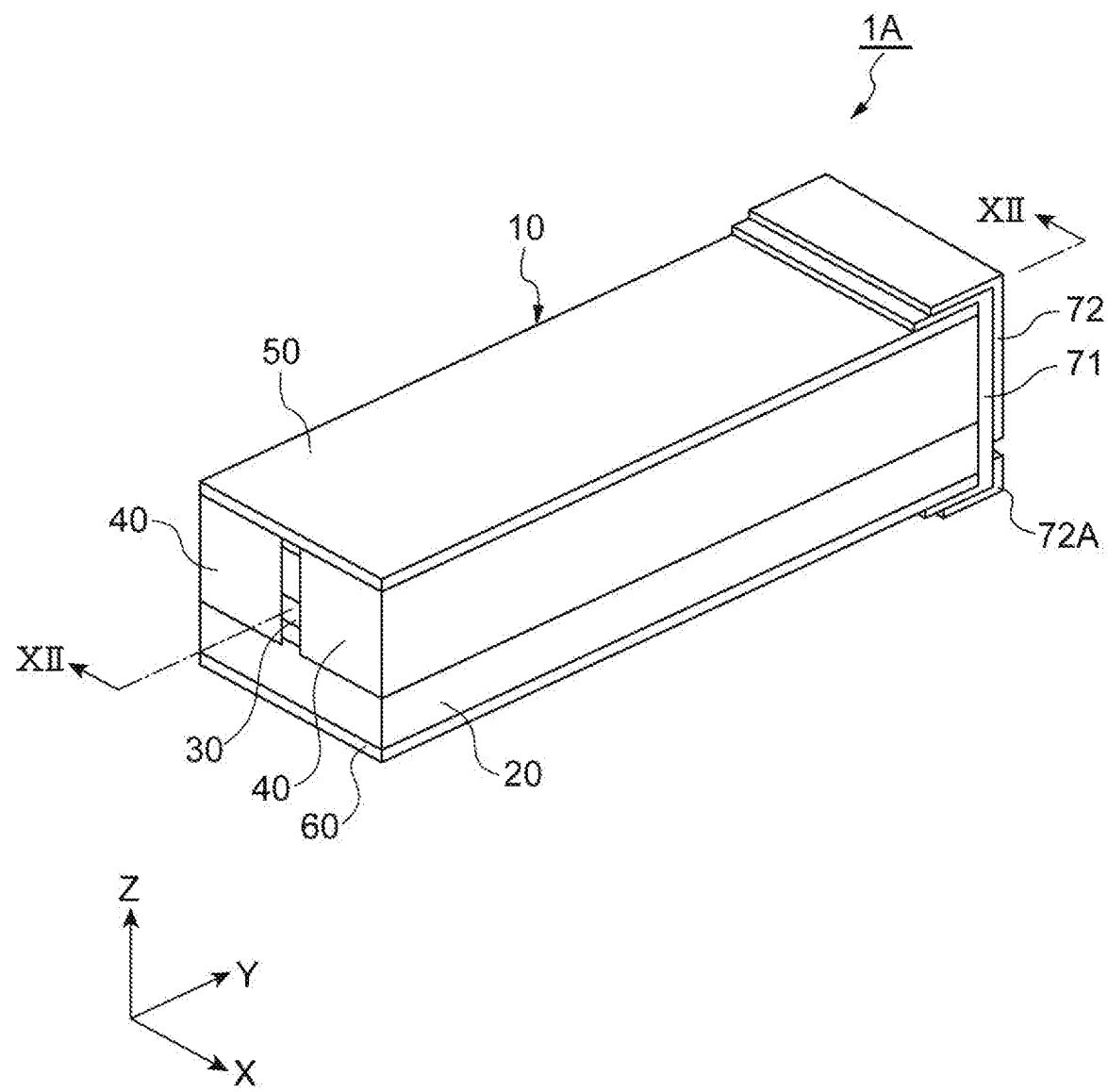
FIG. 11 is a perspective view showing a quantum cascade semiconductor laser according to another embodiment.
Figure 12:
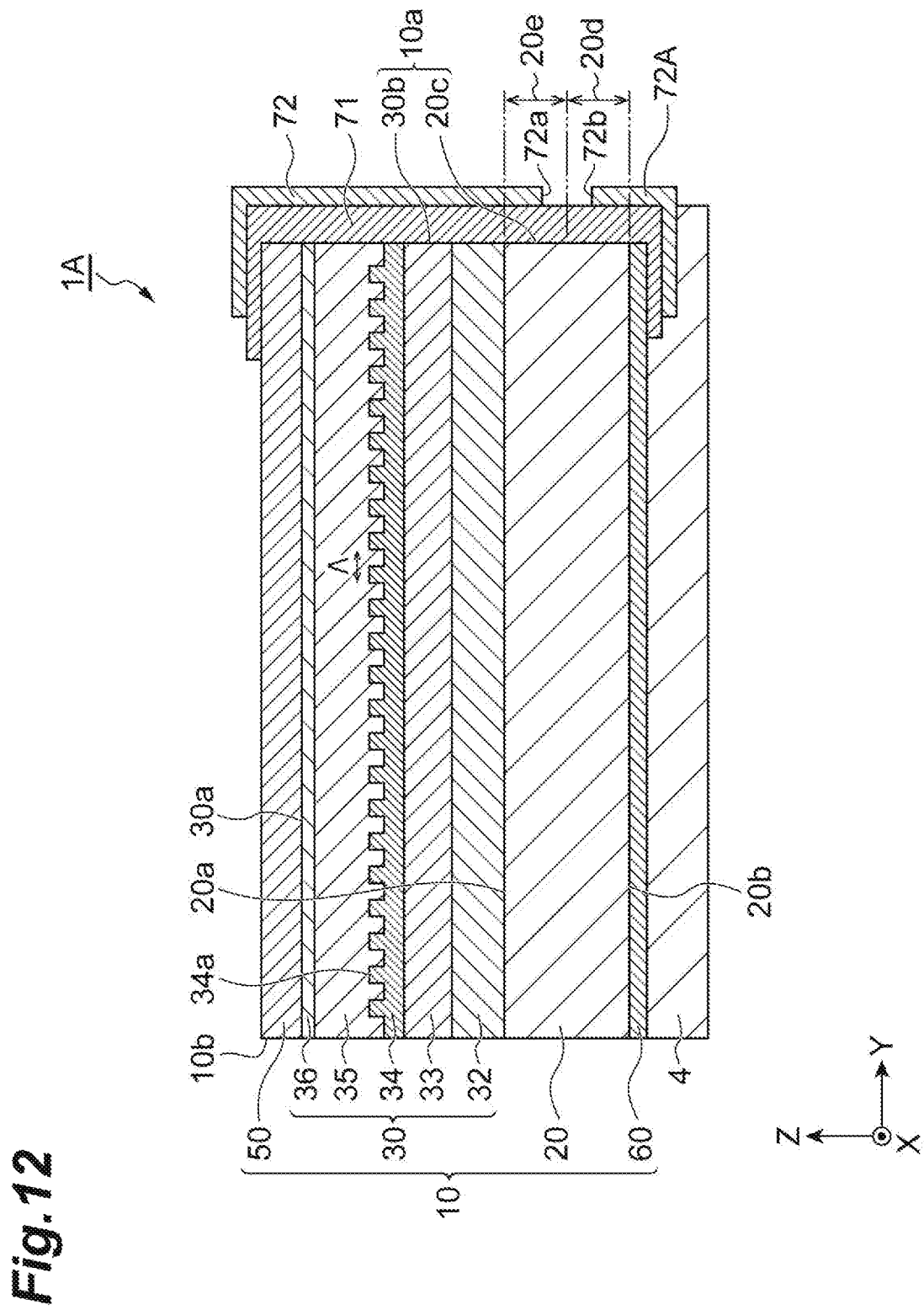
FIG. 12 is a cross-sectional view taken along line XII-XII shown in FIG. 11.

FIG. 11 is a perspective view showing the quantum cascade laser 1A according to the first modification of the embodiment. FIG. 12 is a cross-sectional view, taken along line XII-XII shown in FIG. 11, which is parallel to the YZ-plane in the present embodiment. The quantum cascade laser 1A is actually mounted on the submount 3 with the solder material 4 in the above-described embodiment. FIG. 12 shows that the solder material 4 adheres to the bottom face of the quantum cascade laser 1A. The present modification differs from the above embodiment in that the quantum cascade laser 1A further includes a metal film 72A (the second metal film). The metal film 72A extends from the substrate end face 20c to the lower electrode 60, and has an edge 72b on the area 20d of the substrate end face 20c. The edge 72b extends on the area 20d along an axis in the X direction. That is, the metal film 72A covers the near zone, close to the rear end face 10a, of the lower electrode 60, and covers a part of the area 20d, close to the rear face 20b and far from the edge 72b of the metal film 72A in the Z direction. In addition, the edge 72b of the metal film 72A on the area 20d of the substrate end face 20c is spaced apart from the edge 72a of the metal film 72 on the area 20e of the substrate end face 20c in the Z direction, and is not in contact with the edge 72a of the metal film 72. The distance between the edge 72b and the edge 72a in the Z direction is in a range of, for example, 5 to 50 micrometers, more and a better range of the above distance is, for example, 10 to 50 micrometers.

In the quantum cascade laser 1A, the separation of the edge 72b of the metal film 72A from the edge 72a on the rear end face 10a in the Z direction can electrically insulate the metal film 72A from the metal film 72. Accordingly, the quantum cascade laser 1A prevents the application of voltage for lasing of the quantum cascade laser 1A to the lower electrode 60 from causing the application of the voltage to the metal film 72 via the metal film 72A and the solder material 4, so that the voltage is not applied to the insulating film 71, which is between the upper electrode 50 and the metal film 72 on the upper electrode 50, to avoid the breakdown of the insulating film 71. The quantum cascade laser 1A also has an advantageous effect provided by the quantum cascade laser 1 according to the embodiment.

Figure 13A:
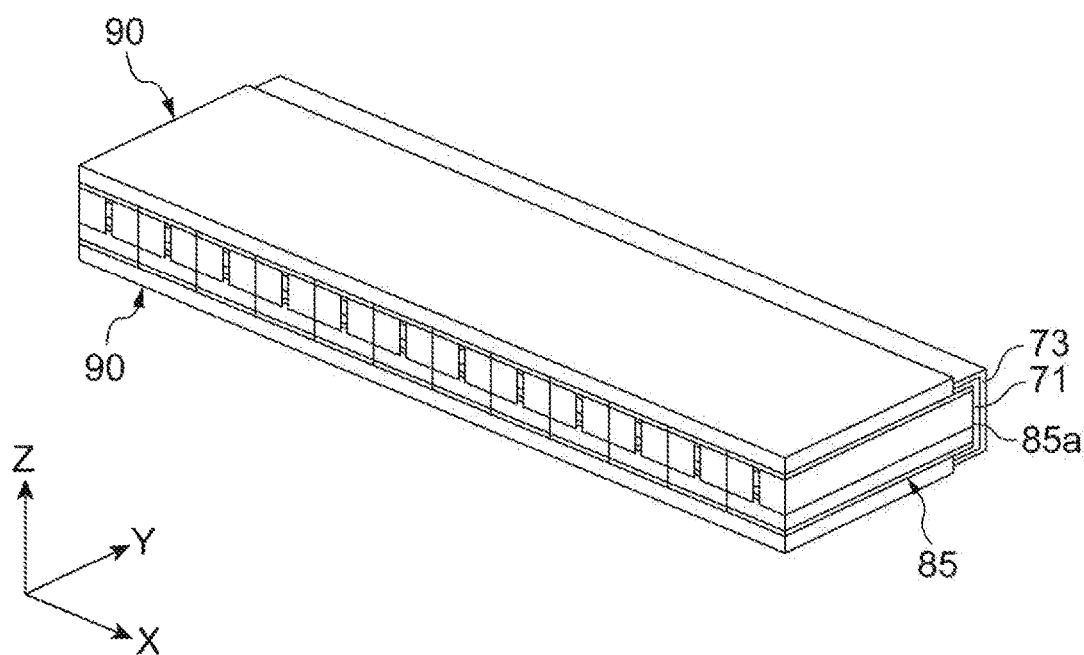
FIG. 13A is a schematic view showing a major process in the method according to the other embodiment.
Figure 13B:
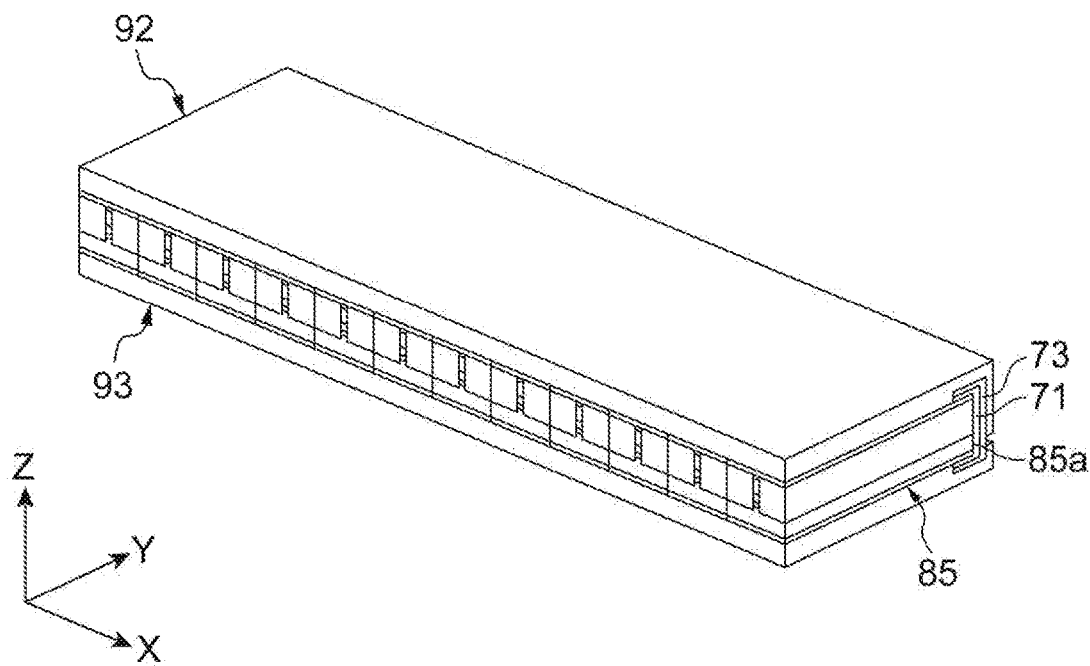
FIG. 13B is a schematic view showing a major process in the method according to the other embodiment.

Subsequently, a description will be given of an exemplary method for fabricating the quantum cascade laser 1A according to the present modification. The present method has multiple process steps, which are divided into a former part and a latter part. The former part has the same process steps as those in the first embodiment method and ends at the step of forming the insulating film 71 on the end face 85a (shown in FIG. 8A), and the latter part begins with the step of forming the metal film 72 and the metal film 72A on the end face 85*a*. In the following description, the latter part will be described in detail. FIGS. 13A and 13B are views each showing a process of fabricating the quantum cascade laser 1A shown in FIG. 11. As shown in FIG. 13A, after the insulating film 71 is formed on the end face 85*a*, a metal film 73 for the metal films 72 and 72A is formed on the end face 85*a*. More specifically, flux containing constituent atoms for the metal film 73 is supplied to the end face 85*a*, for example, by electron beam evaporation, to form the metal film 73 on the end face 85*a*, and also fries along the upper electrode 50 and the insulating film 71 on the lower electrode 60 to form deposited material on the upper electrode 50 and the lower electrode 60.

As shown in FIG. 13B, protectors 92 and 93 are prepared. The protector 90 covering the upper electrode 50 and the other protector 90 covering the lower electrode 60 are removed. After the removal, the protector 92 is attached to the chip bar so as to cover the upper electrode 50 therewith, and the protector 93 is attached so as to the chip bar to cover the lower electrode 60 therewith. The protectors 92 and 93 each have an L-character shape, which is formed by a longitudinal part extending in the X direction and a vertical part extending in the Z direction, and the longitudinal part and the vertical part meet with each other at their ends. The protectors 92 and 93 are attached to the chip bar. The longitudinal part of the protector 92 covers the entire top face of the upper electrode 50, and the longitudinal part of the protector 93 covers the entire top face of the lower electrode 60. The vertical part of each of the protectors 92 and 93 is positioned to the end face 85*a*. The vertical parts of the protectors 92 and 93 have respective tips which can define the edge 72*b* of the metal film 72A and the edge 72*a* of the metal film 72. The protectors 92 and 93 thus attached define a gap on the metal film 73 between the vertical parts. The chip bar is dry-etched with the protectors 92 and 93 to remove a part of the metal film 73 on the end face 85*a*, thereby producing the metal film 72A with the edge 72*b* and the metal film 72 with the edge 72*a* from the metal film 73. The dry-etching includes, for example, RIE. The chip bar 85 thus etched is separated into a quantum cascade laser 1A, as shown in FIG. 11, by cleaving.

(Second Modification)

Figure 14:
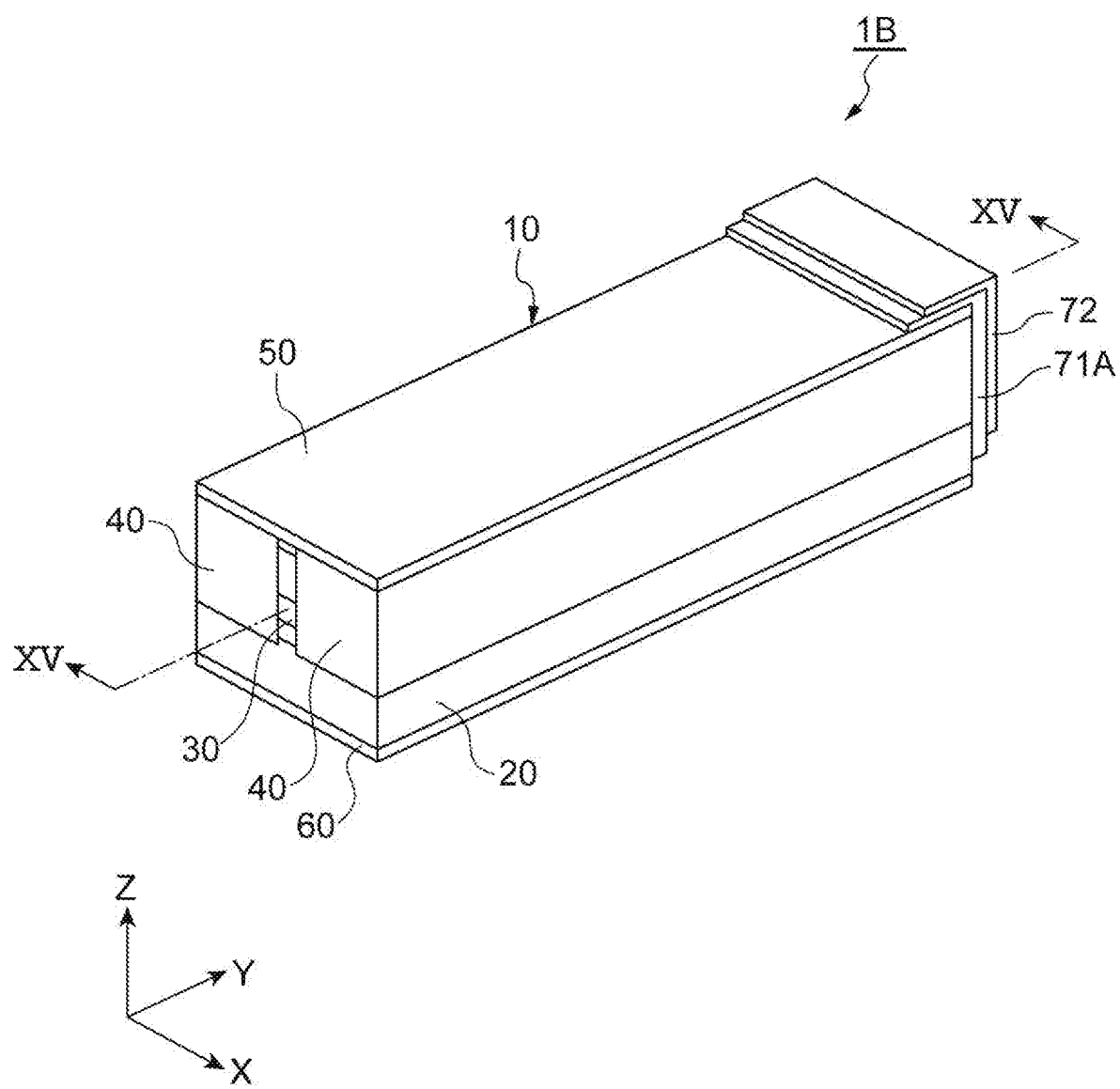
FIG. 14 is a perspective view showing a quantum cascade semiconductor laser according to still another embodiment.
Figure 15:
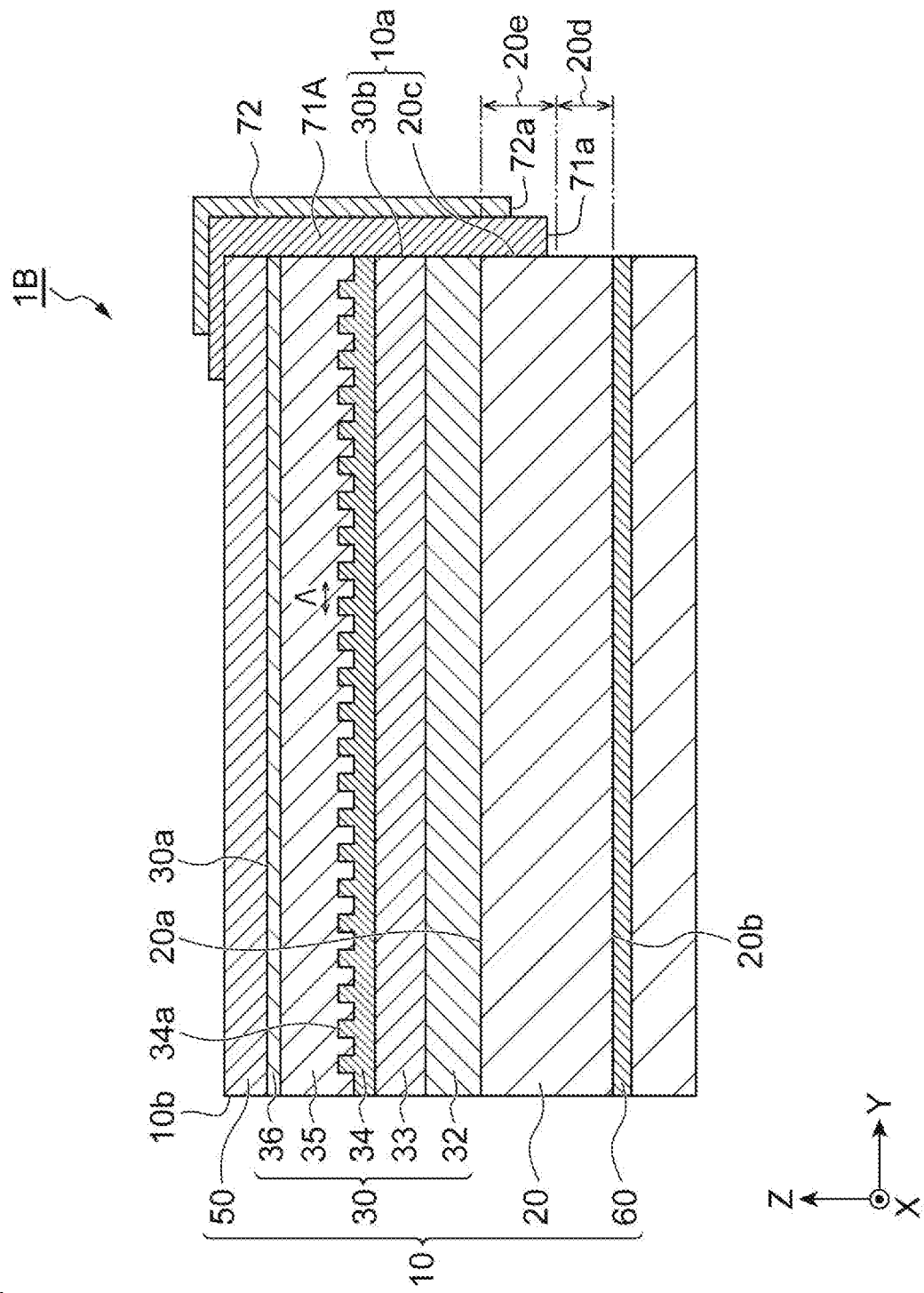
FIG. 15 is a cross-sectional view taken along line XV-XV shown in FIG. 14.

FIG. 14 is a perspective view showing a quantum cascade laser 1B according to the second modification of the above embodiment. FIG. 15 is a cross-sectional view, taken along line XV-XV shown in FIG. 14, and this cross-section is equivalent to a plane parallel to the YZ-plane. The modified example is different from the above embodiment in coating of the insulating film on the end face 85*a*. The insulating film 71 in the above embodiment is disposed on the lower electrode 60, and the insulating film 71A in this modification is apart from the lower electrode 60. The insulating film 71 in the above embodiment covers all of the end face 85*a*, and the insulating film 71A in this modification covers a part of the end face 85*a*. The insulating film 71A has an edge 71*a* on the area 20*e* of the substrate end face 20*c*, and extends on the area 20*e* in a direction from one of the sides of the laser and the other, for example, the X direction. The insulating film 71A covers all of the laminate end face 30*b* and the near portion, close to the rear end face 10*a* in the Y direction, of the upper electrode 50, and covers the edge 71*a* of the insulating film 71A in a part, close to the principal surface 20*a* in the Z direction, of the area 20*e*. The edge 71*a* of the insulating film 71A is positioned closer to the back surface 20*b* in the Z direction with respect to the edge 72*a* of the metal film 72 on the area 20*e*.

The quantum cascade laser 1B, which does not have any insulating film 71A on the lower electrode 60, has the same advantageous effects as that of that the quantum cascade laser 1 according to the above embodiment. Disposing the insulating film 71A on a part of the substrate end face 20*c* makes heat dissipation through the substrate end face 20*c* improved. The quantum cascade laser 1B is provided with improved device characteristics and reliability.

Figure 16A:
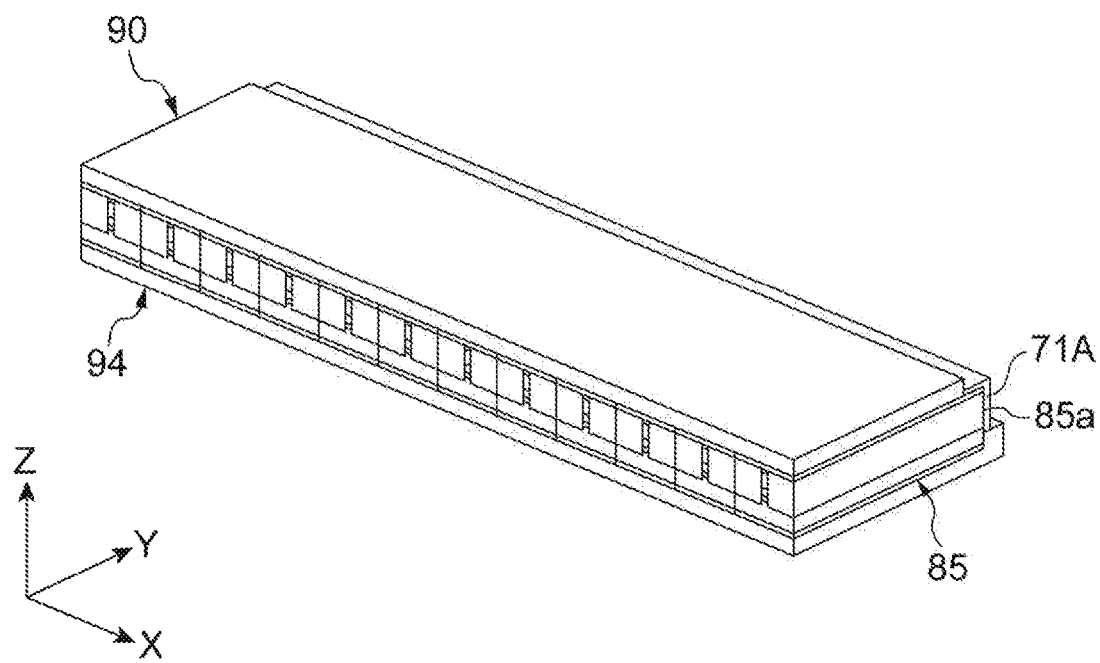
FIG. 16A is a schematic view showing a major process in the method according still another embodiment.
Figure 16B:
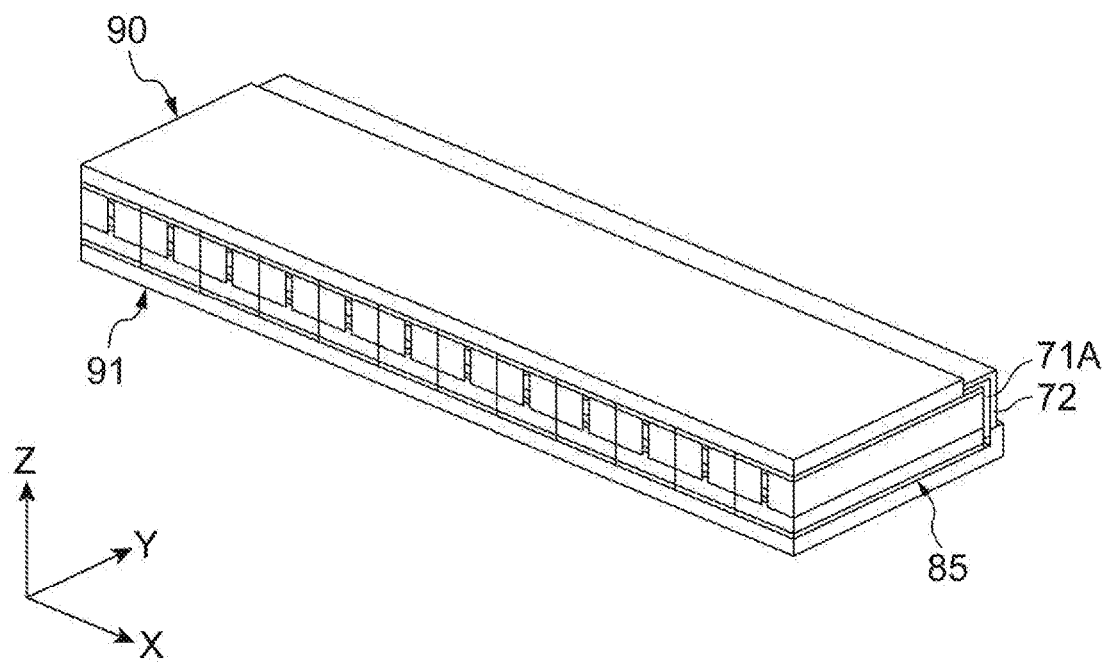
FIG. 16B is a schematic view showing a major process in the method according still another embodiment.

Subsequently, a description will be given of an exemplary method for fabricating the quantum cascade laser 1B according to the present modification. The present method includes multiple process steps including an former part, which has the same process steps as those in the first embodiment method and ends at the process of forming the chip bar 85 (as shown in FIG. 7B), and a latter part, which begins with the step that follows the step of forming the insulating film 71A on the end face 85*a*. In the following description, the latter part will be described in detail. FIGS. 16A and 16B are views showing a process for manufacturing the quantum cascade laser 1B shown in FIG. 14. First, as shown in FIG. 16A, a protector 94 is prepared. The protector 94 have an L-character shape, which has a longitudinal part extending in the X direction, and a vertical part extending in the Z direction, and the longitudinal part and the vertical part meet with at the respective ends. The protector 90 is attached to the chip bar 85 to cover all most all of the upper electrode 50 except for the near zone, close to the end face 85*a* in the Y direction, of the upper electrode 50, and the protector 94 is attached to the chip bar 85 to cover the lower electrode 60. The vertical part of the protector 94 is positioned to the end face 85*a*. The protectors 90 and 94 are attached to the bar, and the vertical part of the protector 94 has a tip which defines the edge 71*a* of the insulating film 71. The longitudinal part of the protector 94 covers the near zone, close to the end face 85*a* in the Y direction, of the entire top face of the lower electrode 60. The vertical part of the protector 94 has a length slightly shorter than that of the vertical part of the protector 91.

Next, an insulating film 71A is formed on the end face 85*a*. Specifically, flux containing constituent atoms of the insulating film 71A is supplied toward the end face 85*a* to form deposited material, i.e., the insulating film 71A, on the end face 85*a*, for example, by electron beam evaporation. At this evaporation, the flux flies around the upper electrode 50 to form the deposited material for the insulating film 71A on the upper electrode 50 of the chip bar 85. Thereafter, the protector 94 covering the lower electrode 60 is removed from the chip bar 85. The protector 91 of the above embodiment is attached to the chip bar 85 so as to cover the lower electrode 60, and the vertical portion of the protector 91 is positioned to the lower end of the end face 85*a*. The vertical portion of the protector 91 covers all the part, closer to the lower electrode 60 in the Z direction, of the end face 85*a* with respect to the edge 72*a* of the metal film 72. The longitudinal portion of the protector 91 covers the entire top face of the lower electrode 60.

After attaching the protectors to the chip bar 85, the metal film 72 is formed on the end face 85*a*. Specifically, flux of constituent atoms for the metal film 72 is supplied toward the end face 85*a*, for example, by electron beam evaporation to form deposited material, i.e., the metal film 72, on the end face 85*a*. In this evaporation, the flux for the metal film 72 flies along the insulating film 71 on the upper electrode 50 of the chip bar 85 to form the deposited material on the upper electrode 50. Finally, as in the above embodiment, the chip bar 85 thus deposited is separated into semiconductor chips, for example, by cleavage of the chip bar 85. These processes bring a quantum cascade laser 1B, as shown in FIG. 14, to completion.

(Third Modification)

Figure 17:
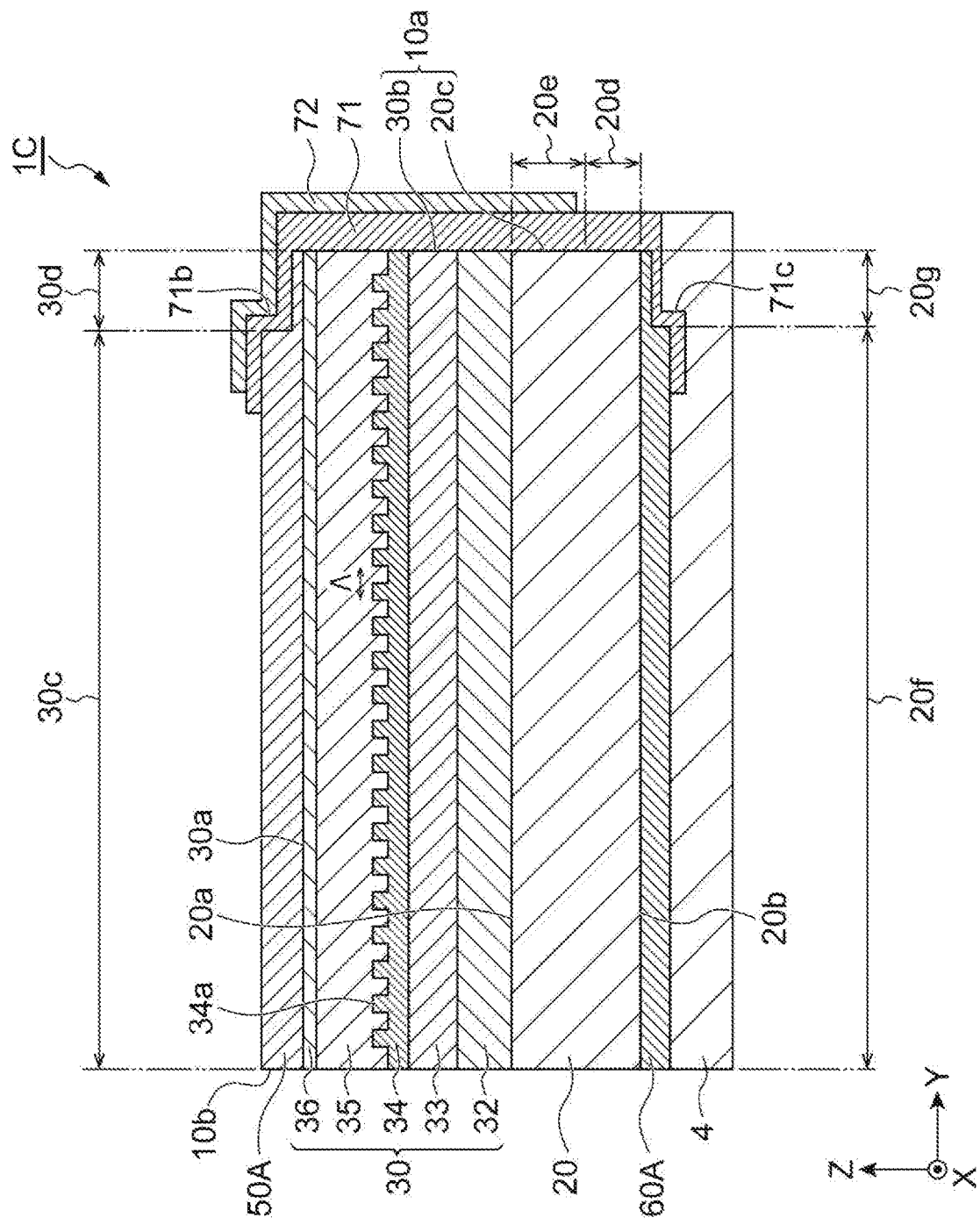
FIG. 17 is a cross-sectional view showing a quantum cascade semiconductor laser according to yet another embodiment.

FIG. 17 is a cross-sectional view showing a quantum cascade laser 1C according to the third modification of the above embodiment. Specifically, the cross-section shown in FIG. 17 is taken along a plane parallel to the YZ plane and illustrates the semiconductor laminate 30 of the quantum cascade laser 1C. This modified example is different from the above embodiment in thicknesses of the upper and lower electrodes. Specifically, the upper and lower electrodes 50A and 60A each have one portion with a small thickness and another portion with a large thickness. As shown in FIG. 17, the upper face 30a of the semiconductor laminate 30 has a first region 30c and a second region 30d, which is between the laminate end face 30b and the first region 30c along an axis of the Y direction. The first and second regions 30c and 30d are arranged in the axis of the Y direction. The first region 30c is different from the second region 30d, and is contiguous to the front end face 10b. The second region 30d is disposed at one edge of the upper face 30a on an axis of the Y direction, and the principal face of the second region 30d is contiguous to the rear end face 10a. The upper electrode 50A is disposed on both the first and second regions 30c and 30d. The upper electrode 50A has one portion on the first region 30c and another portion on the second region 30d, and in the upper electrode 50A, the other portion has a thickness smaller than that of the one portion.

Further, the back surface 20b includes a first area 20f and a second area 20g, which is between the substrate end face 20c and the first area 20f along an axis of the Y direction. The first and second areas 20f and 20g are arranged along the axis of the Y direction. In the back surface 20b, the first area 20f is different from the second area 20g, and is contiguous to the front end face 10b. The second area 20g is disposed at one end of the back surface 20b, and is contiguous to the rear end face 10a. The lower electrode 60A is disposed on the first and second areas 20f and 20g. The lower electrode 60A has one portion on the first area 20f and another portion on the second area 20g, and the one portion on the first area 20f has a thickness smaller than that of the other portion on the second area 20g.

In order to avoid deterioration of heat dissipation in the quantum cascade laser 1C, the upper and lower electrodes 50A and 60A have respective thicknesses, each of which is in the range of 5 to 10 micrometers in the Z direction, in the one portions thereof on the first region 30c and the first area 20f. In contrast, the upper and lower electrodes 50A and 60A have respective thicknesses, each of which is in the range of 0.5 to 1.0 micrometers in the Z direction, in the other portions on the second region 30d and the second area 20g. The upper and lower electrodes 50A and 60A have respective lengths, each of which is in the range of 10 to 100 micrometers in the Y direction, in the other portions on the second region 30d and the second area 20g.

The insulating film 71 is disposed on the region 30c to cover the upper electrode 50A, and is disposed on the area 20f to cover the lower electrode 60A. The insulating film 71 is conformal with the upper electrode 50A, and has a stepped portion 71b (difference in level) at the boundary between the one portion and the other portion of the upper electrode 50A on the first and second regions 30d and 30c. The insulating film 71 is conformal with the lower electrode 60A, and has a stepped portion 71c (difference in level) at the boundary between the one portion and the other portion of the lower electrode 60A on the first and second areas 20g and 20f. In one example, the stepped portions 71b and 71c each extend in the direction orthogonal to the Y direction. The metal film 72 extends on a part, which is on the second region 30d, of the upper electrode 50A.

Metal films for the upper and lower electrodes 50A and 60A have respective thinned portions around cleavage lines, and the thinning make it easy to conduct cleavage for forming chip bars, each of which has the partly-thinned upper and lower electrodes 50A and 60A in the vicinity of the rear end face 10a (specifically, the laminate end face 30b and the substrate end face 20c), allowing yield enhancement in the method for fabricating the quantum cascade laser 1C. The thickness of the one portion, which is on the second region 30d, of the upper electrode 50A is smaller than that of the other portion, which is on the first region 30c, of the upper electrode 50A, so that the one portion of the upper electrode 50A has a sheet electrical resistance larger than that of the other portion of the upper electrode 50A. Further, the thickness of the one portion, which is on the second area 20g, of the lower electrode 60A is smaller than that of the other portion, which is on the first area 20f, of the lower electrode 60A, so that the one portion of the lower electrode 60A has a sheet electrical resistance larger than that of the other portion of the lower electrode 60A. There large-resistance portions of the upper and lower electrodes 50A and 60A make it possible to reduce the leakage current flowing in the vicinity of the rear end face 10a. The reduced leakage current can provide the quantum cascade laser 1C with improved device performances (for example, the threshold current can be reduced). The quantum cascade laser 1C, which has thin portions of the upper and lower electrodes 50A and 60A in thickness on the second area 20g and the second region 30d, also has the same advantageous effects as that of the above embodiment.

Figure 18A:
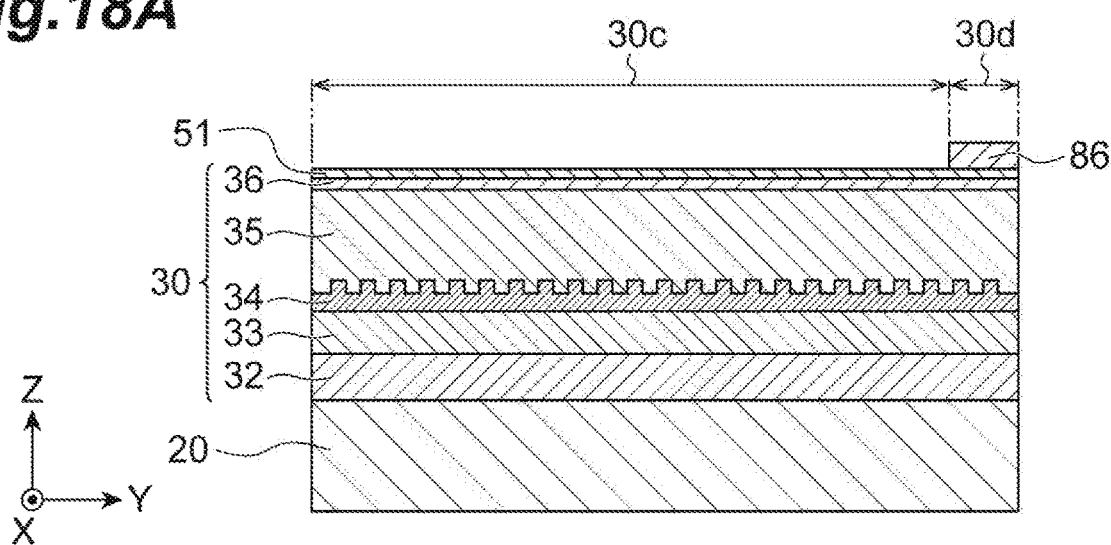
FIG. 18A is a schematic view showing a major process in the method according to yet another embodiment.
Figure 18B:
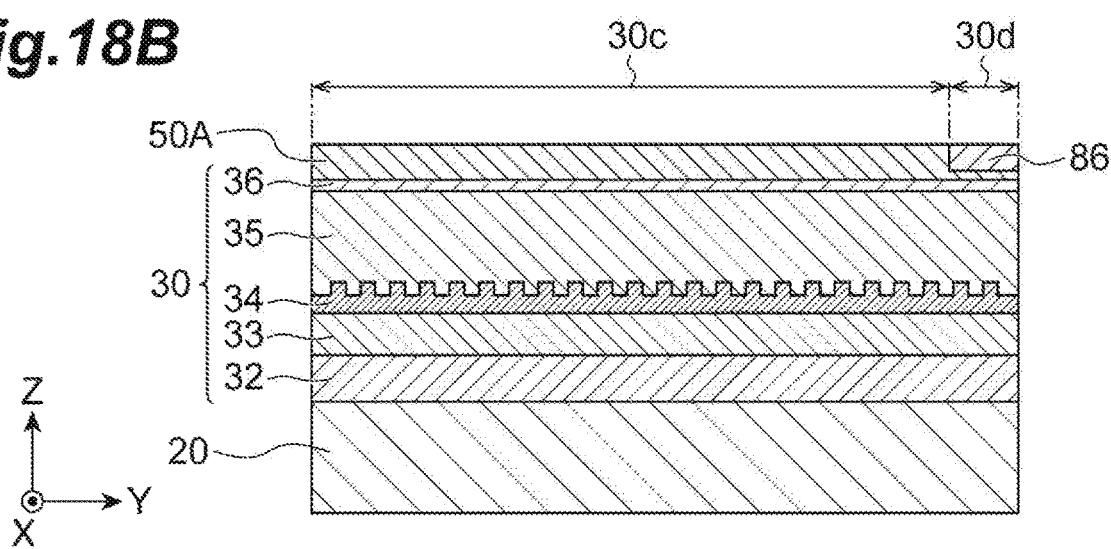
FIG. 18B is a schematic view showing a major process in the method according to yet another embodiment.
Figure 18C:
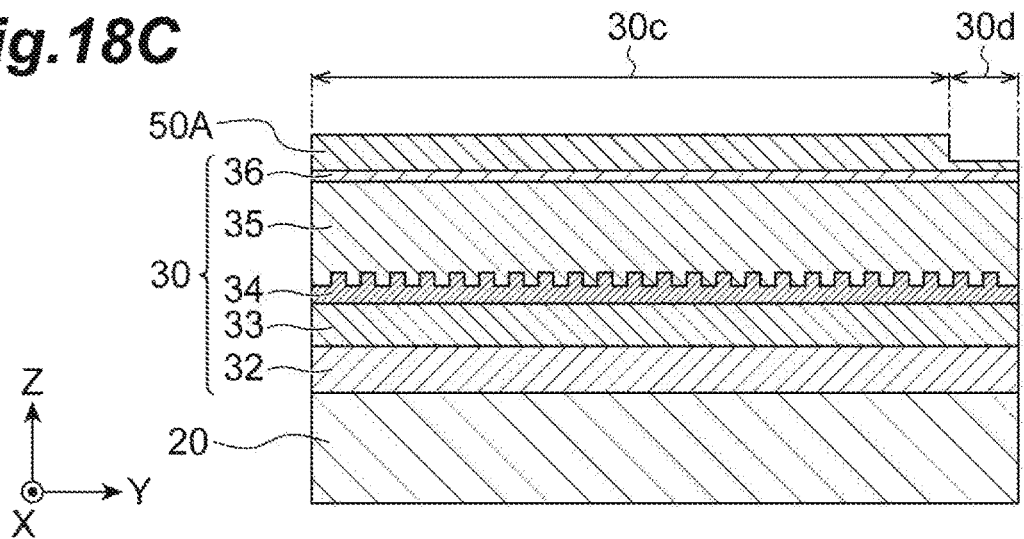
FIG. 18C is a schematic view showing a major process in the method according to yet another embodiment.

Subsequently, a description will be given of a method for fabricating the quantum cascade laser 1C according to the present modification. The method for fabricating the quantum cascade laser 1C according to this modification has a former part, which has the same process steps as those in the first embodiment method and ends at the third crystal growth step (as shown in FIG. 5C) of forming the two current block portions 40, and a latter part, which begins with the process of forming the upper electrode 50A on the semiconductor laminate 30. In the following description, the latter part will be described in detail. FIGS. 18A and 18B are views showing a process of fabricating the quantum cascade laser 1C shown in FIG. 17. FIGS. 18A to 18C are cross sectional views, each taken along a line equivalent to the YZ plane, showing the semiconductor laminate 30 of the quantum cascade laser 1C. As shown in FIG. 18A, a thin metal film 51 for the upper electrode 50A is formed on the entire upper face 30a of the semiconductor laminate layer 30. Thereafter, resist is applied to the metal film 51, and then is pattered to form a resist mask 86, which has a pattern covering the second region 30d.

As shown in FIG. 18B, a metal film 51 is further formed on the thin metal film 51 with the resist mask 86. In this deposition, the metal film 51 is not formed on the resist mask 86, and deposited on the metal film 51 on the region 30c in the opening of the resist mask. The resulting metal film 51 on the second region 30d has a thickness smaller than that of the metal film 51 on the first region 30c. As shown in FIG. 18C, the resist mask 86 is removed to form the upper electrode 50A on the upper face 30a. Subsequently, the lower electrode 60A is formed on the back surface 20b of the semiconductor substrate 20 in the same manner as that of forming the upper electrode 50A. The subsequent steps are the same as those in the above embodiment.

Specifically, flux of metal particles for the metal film 72 is supplied toward the end face 85a to form the metal film 72, and is bounced back by the stepped portion 71b, which hinders the flux from flying along the upper electrode 50A. This stepped portion makes it difficult for the metal film 72 to be formed on the upper electrode 50A on the region 30c, ensuring that electrical insulation between the metal film 72 and the upper electrode 50A. The quantum cascade laser 1C according to the present modification can enhance the insulation in the vicinity of the rear end face 10a, and reduce the occurrence of breakdown of the insulating film 71 in the vicinity of the rear end face 10a. This modification shows that both the upper electrode 50A on the second region 30d and the lower electrode 60A on the second area 20g can be partly thinned and that alternatively one of the upper and lower electrodes 50A and 60A can be partly thinned. Specifically, the upper electrode 50A may be partly thinned on the second region 30d or the lower electrode 60A may be partly thinned on the second area 20g. These three kinds of the quantum cascade lasers 1C each have the same advantageous effects as those of the embodiment.

Figure 19:
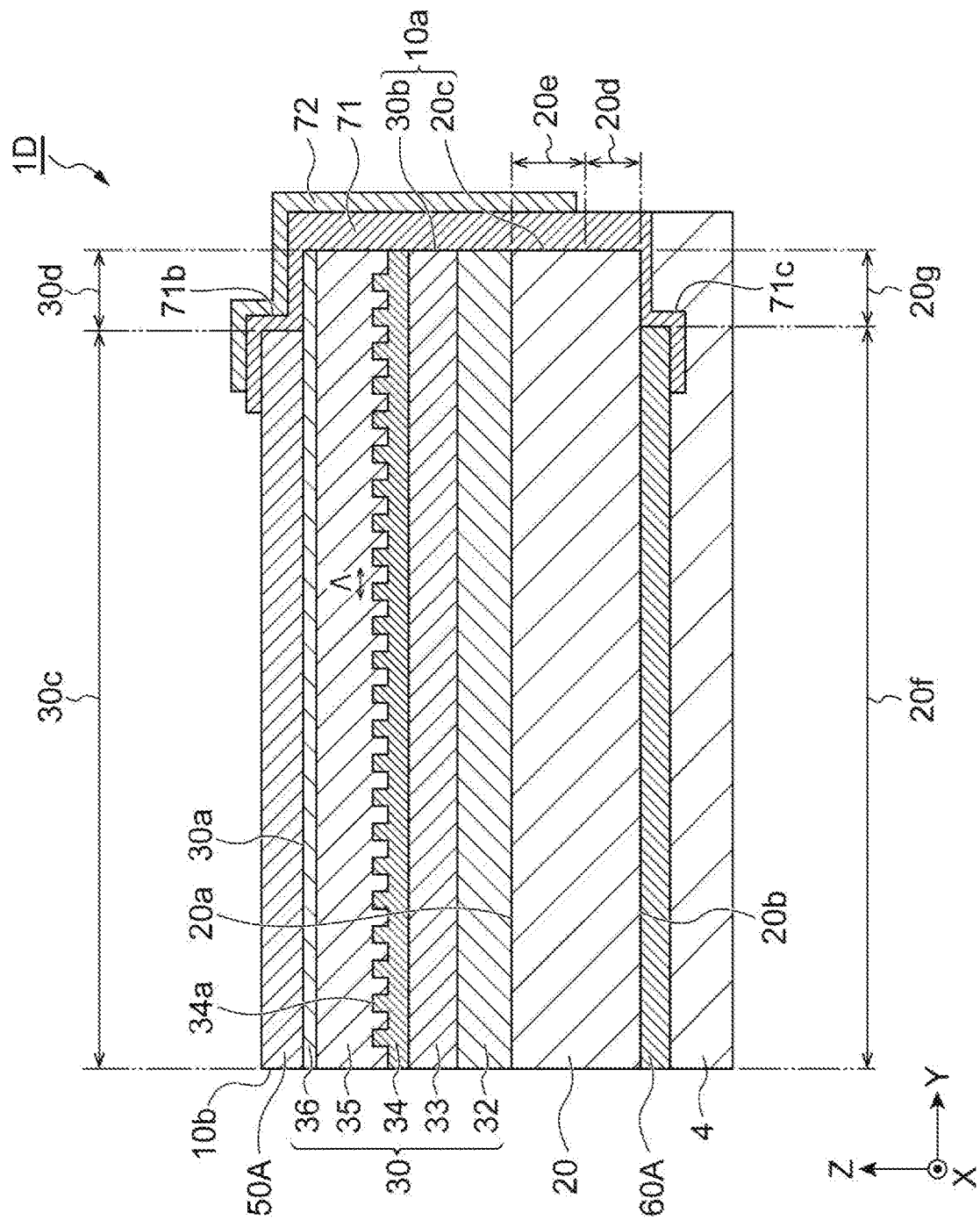
FIG. 19 is a cross-sectional view showing the quantum cascade semiconductor laser according to yet another embodiment.

FIG. 19 is a cross-sectional view showing a quantum cascade laser 1D according to the present modification. As shown in FIG. 19, the upper electrode 50A is disposed on the first region 30c and is not disposed on the second region 30d, and the lower electrode 60A may be disposed on the first area 20f and not be disposed on the second area 20g. The partial removal of the upper and lower electrodes 50A and 60A in the vicinity of the rear end face 10a allows the quantum cascade laser 1D to have the above-described advantageous effects. Specifically, separating the metal films for the upper and lower electrodes 50A and 60A apart from lines to be cleaved make it easy to form the rear face 10a by cleavage, which provides increase in yield in fabricating the quantum cascade laser 1D. Spacing the upper and lower electrodes 50A and 60A apart from the rear end face 10a makes the electric resistance in the vicinity of the rear end face 10a large, thereby reducing the leakage current flowing in the vicinity of the rear end face 10a. The quantum cascade laser 1D has excellent device characteristics (in particular, the reduction in the threshold current).

Figure 20A:
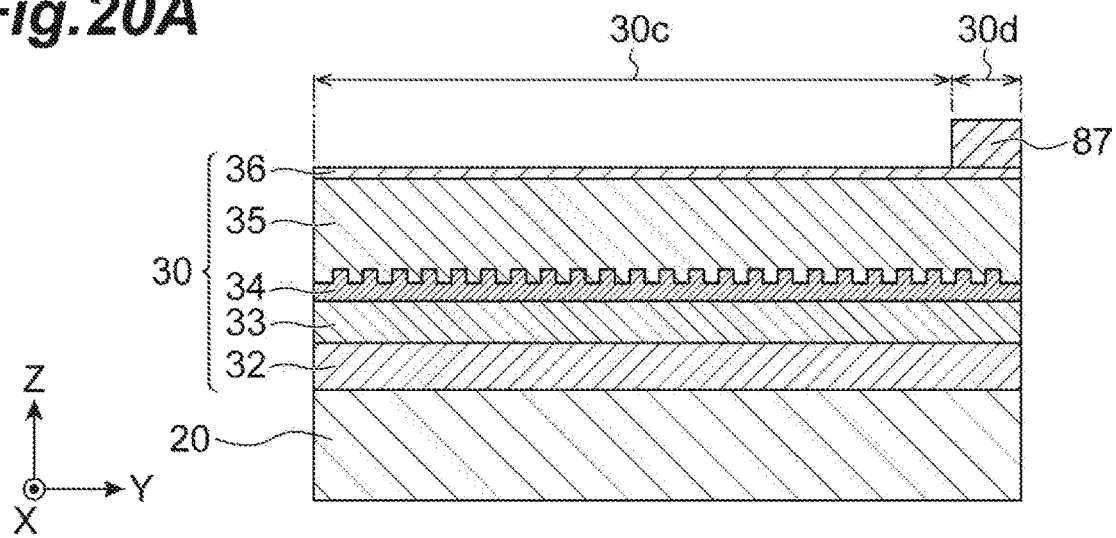
FIG. 20A is a schematic view showing a major process in the method according to yet another embodiment.
Figure 20B:
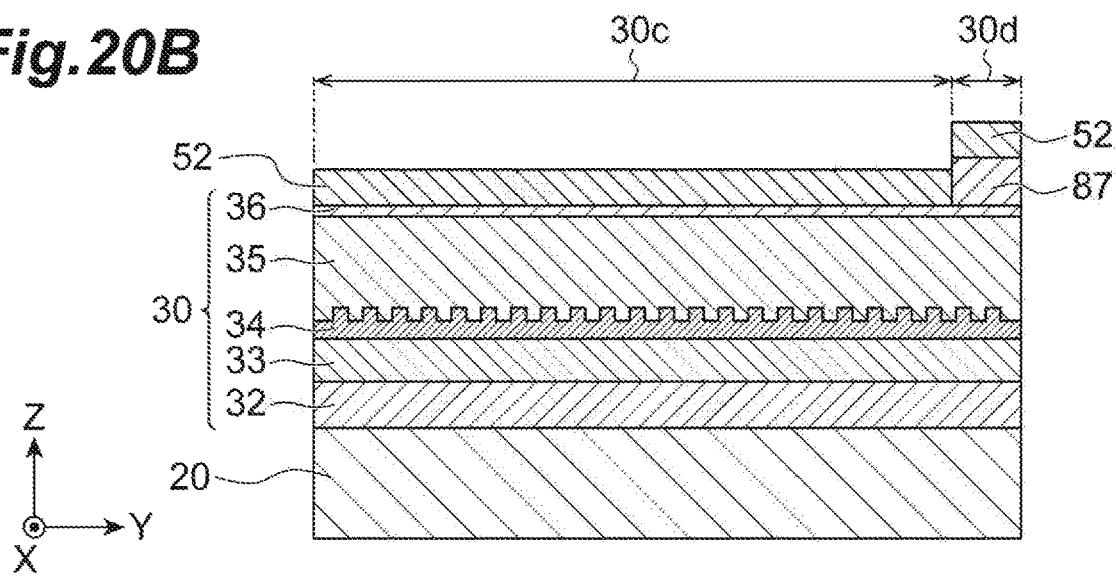
FIG. 20B is a schematic view showing a major process in the method according to yet another embodiment.
Figure 20C:
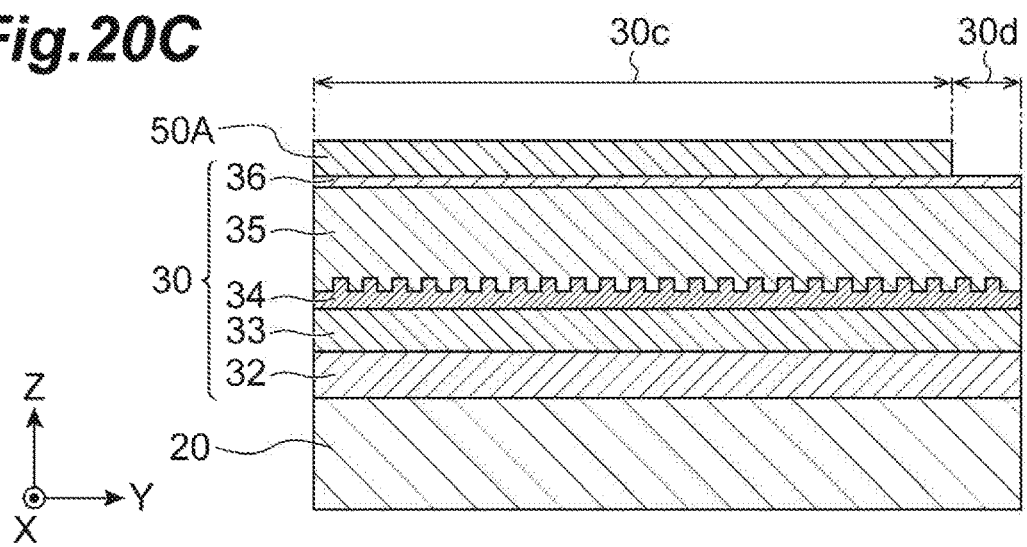
FIG. 20C is a schematic view showing a major process in the method according to yet another embodiment.

In fabricating the quantum cascade laser 1D, after the third crystal growth step (shown in FIG. 5C) of forming the two current block portions 40 according to the above embodiment, the following process can be carried out. FIGS. 20A to 20C are schematic views each showing a process of fabricating the quantum cascade laser 1D shown in FIG. 19. FIGS. 20A to 20C each show a cross section, which is a plane parallel to the YZ plane, including the semiconductor laminate 30 of the quantum cascade laser 1D. As shown in FIG. 20A, resist is patterned to form a resist mask 87 with a pattern, which covers the second region 30d. Next, as shown in FIG. 20B, a metal film 52 for the upper electrode 50A is formed on the first region 30c and the resist mask 87, for example, by vapor deposition. As shown in FIG. 20C, the deposition of the metal film 52 is followed by lifting-off which simultaneously removes the resist mask 87 and the deposited material of the metal film 52 thereon, thereby forming the upper electrode 50A on the back surface 20b.

Subsequently, the lower electrode 60A is formed on the back surface 20b of the semiconductor substrate 20 in the same manner as the process for forming the upper electrode 50A. The subsequent process steps are the same as those in the above embodiment. In the quantum cascade laser 1D, the upper and lower electrodes 50A and 60A are disposed on the first region 30c and the first area 20f, respectively. If needed, the upper electrode 50A is disposed on the first region 30c and the lower electrode 60A is disposed on the entire back surface, and alternatively, the lower electrode 60A is disposed on the first area 20f and the upper electrode 50A is disposed on the upper face 30a. These quantum cascade lasers each have the same advantageous effects as the embodiment.

The quantum cascade semiconductor laser of the present invention is not limited to the above-described quantum cascade semiconductor lasers, and other modifications are possible. For example, the above-described embodiment and each of the modifications may be combined with each other in accordance with purposes and effects according to the above-described embodiments. The insulating film and the metal film are disposed on the rear end face of the semiconductor device in the above-described embodiments and modifications, but the insulating film and the metal film may be disposed on the front end face or on both the front and rear end faces of the semiconductor device. The quantum cascade laser according to the above-described embodiments and modifications each have a buried-hetero structure, and if needed, has another structure, such as a high mesa structure with an insulating film (for example, a dielectric film, such as SiO$_2$) formed on both side faces of the semiconductor laminate 30. Further, the above-described embodiments and modifications each have a DFB quantum cascade laser with the diffraction grating layer 34, but the present invention is not limited thereto. The above-described embodiments and modifications can be similarly used in, for example, a Fabry-Perot (FP) type quantum cascade laser without the diffraction grating layer 34. The FP-type quantum cascade laser has the same improvement as the DFB type quantum cascade laser. The quantum cascade laser according to the above-described embodiments and modifications includes the upper electrode working as the cathode electrode, and the lower electrode working as the anode electrode. If needed, the quantum cascade laser according to the above-described embodiments and modifications may include the upper electrode working as the anode electrode and the lower electrode working as the cathode electrode as well. This quantum cascade laser has the same effects as the above-described embodiments and modifications.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising:
   a substrate including a principle surface, a back surface, and a substrate end face, the principal surface and the back surface being arranged along a first axis, the principal surface being opposite to the back surface, the substrate end face intersecting a second axis, and the second axis intersecting the first axis;
   a semiconductor laminate disposed on the principal surface of the substrate, the semiconductor laminate having a laminate end face, a core layer extending from the laminate end face along the second axis, and a cladding layer disposed on the core layer, the substrate end face and the laminate end face extending along a reference plane intersecting the second axis;
   a first electrode disposed on the semiconductor laminate;

a second electrode disposed on the back surface of the substrate;

an insulating film disposed on the laminate end face and the first electrode;

a first metal film disposed on the laminate end face, the insulating film and the first electrode, the insulating film being between the first metal film and the semiconductor laminate, and a second metal film disposed on the substrate end face and the second electrode, the semiconductor laminate and the substrate being disposed between the first electrode and the second electrode, the substrate end face having a first area and a second area, the first area and the second area being arranged in a direction from the back surface of the substrate to the principal surface thereof, the first metal film having an end in the second area, the insulating film extending to being on the second electrode, and the second metal film on the substrate end face having an end apart from the first metal film.

* * * * *